United States Patent
Takekida

(10) Patent No.: US 10,957,710 B2
(45) Date of Patent: Mar. 23, 2021

(54) THREE DIMENSIONAL SEMICONDUCTOR MEMORY INCLUDING PILLARS HAVING JOINT PORTIONS BETWEEN COLUMNAR SECTIONS

(71) Applicant: Toshiba Memory Corporation, Minato-ku (JP)

(72) Inventor: Hideto Takekida, Nagoya (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/936,561

(22) Filed: Jul. 23, 2020

(65) Prior Publication Data
US 2020/0350336 A1 Nov. 5, 2020

Related U.S. Application Data

(63) Continuation of application No. 16/118,567, filed on Aug. 31, 2018, now Pat. No. 10,763,276.

(30) Foreign Application Priority Data

Dec. 26, 2017 (JP) .............................. JP2017-249588

(51) Int. Cl.
| | |
|---|---|
| *H01L 27/11582* | (2017.01) |
| *G11C 16/28* | (2006.01) |
| *H01L 29/792* | (2006.01) |
| *H01L 27/1157* | (2017.01) |
| *G11C 16/04* | (2006.01) |

(52) U.S. Cl.
CPC ........ *H01L 27/11582* (2013.01); *G11C 16/28* (2013.01); *H01L 27/1157* (2013.01); *H01L 29/7926* (2013.01); *G11C 16/0483* (2013.01)

(58) Field of Classification Search
CPC .................................................. H01L 27/11582
USPC ......................................................... 257/324
See application file for complete search history.

(56) References Cited

U.S. PATENT DOCUMENTS

| | | | | |
|---|---|---|---|---|
| 6,653,170 B1 * | 11/2003 | Lin | ........................ | H01L 24/81 438/117 |
| 6,879,096 B1 * | 4/2005 | Miyazaki | ............. | G09G 3/2011 313/292 |
| 8,278,170 B2 | 10/2012 | Lee et al. | | |
| 8,592,814 B2 * | 11/2013 | Yamazaki | .............. | B82Y 30/00 257/59 |

(Continued)

FOREIGN PATENT DOCUMENTS

JP          2012-15517          1/2012

*Primary Examiner* — Jami Valentine Miller
(74) *Attorney, Agent, or Firm* — Oblon, McClelland, Maier & Neustadt, L.L.P.

(57) ABSTRACT

According to one embodiment, a semiconductor memory includes a plurality of conductors stacked with insulators being interposed therebetween and a pillar through the plurality of conductors. The pillar includes a first columnar section, a second columnar section, and a joint portion between the first columnar section and the second columnar section. The pillar comprises portions that cross the respective conductors and that each function as part of a transistor. The plurality of conductors include a first conductor. The first conductor is closest to the joint portion among the plurality of conductors through the second columnar section, and includes a bending portion formed along the joint portion.

20 Claims, 36 Drawing Sheets

(56) References Cited

U.S. PATENT DOCUMENTS

| | | | |
|---|---|---|---|
| 8,884,357 B2 | 11/2014 | Wang et al. | |
| 9,590,109 B2* | 3/2017 | Miyairi | H01L 29/41791 |
| 9,620,439 B2* | 4/2017 | Williams | H01L 21/4828 |
| 9,842,854 B2 | 12/2017 | Honda | |
| 2006/0169526 A1* | 8/2006 | Honbo | H02M 7/48 |
| | | | 180/444 |
| 2009/0243065 A1* | 10/2009 | Sugino | H01L 25/0657 |
| | | | 257/686 |
| 2009/0267128 A1 | 10/2009 | Maejima | |
| 2009/0268522 A1 | 10/2009 | Maejima | |
| 2010/0207195 A1 | 8/2010 | Fukuzumi et al. | |
| 2011/0189440 A1* | 8/2011 | Appleby | B29C 33/301 |
| | | | 428/156 |
| 2011/0284946 A1 | 11/2011 | Kiyotoshi | |
| 2015/0311144 A1* | 10/2015 | Williams | H01L 23/49568 |
| | | | 257/675 |
| 2016/0078910 A1 | 3/2016 | Sato | |
| 2016/0210103 A1* | 7/2016 | Yoshizumi | H01L 27/14681 |
| 2017/0129052 A1* | 5/2017 | Buller | B33Y 50/02 |
| 2018/0039471 A1* | 2/2018 | Yanagisawa | G06F 3/044 |
| 2018/0067003 A1* | 3/2018 | Michiwaki | G01L 1/22 |

\* cited by examiner

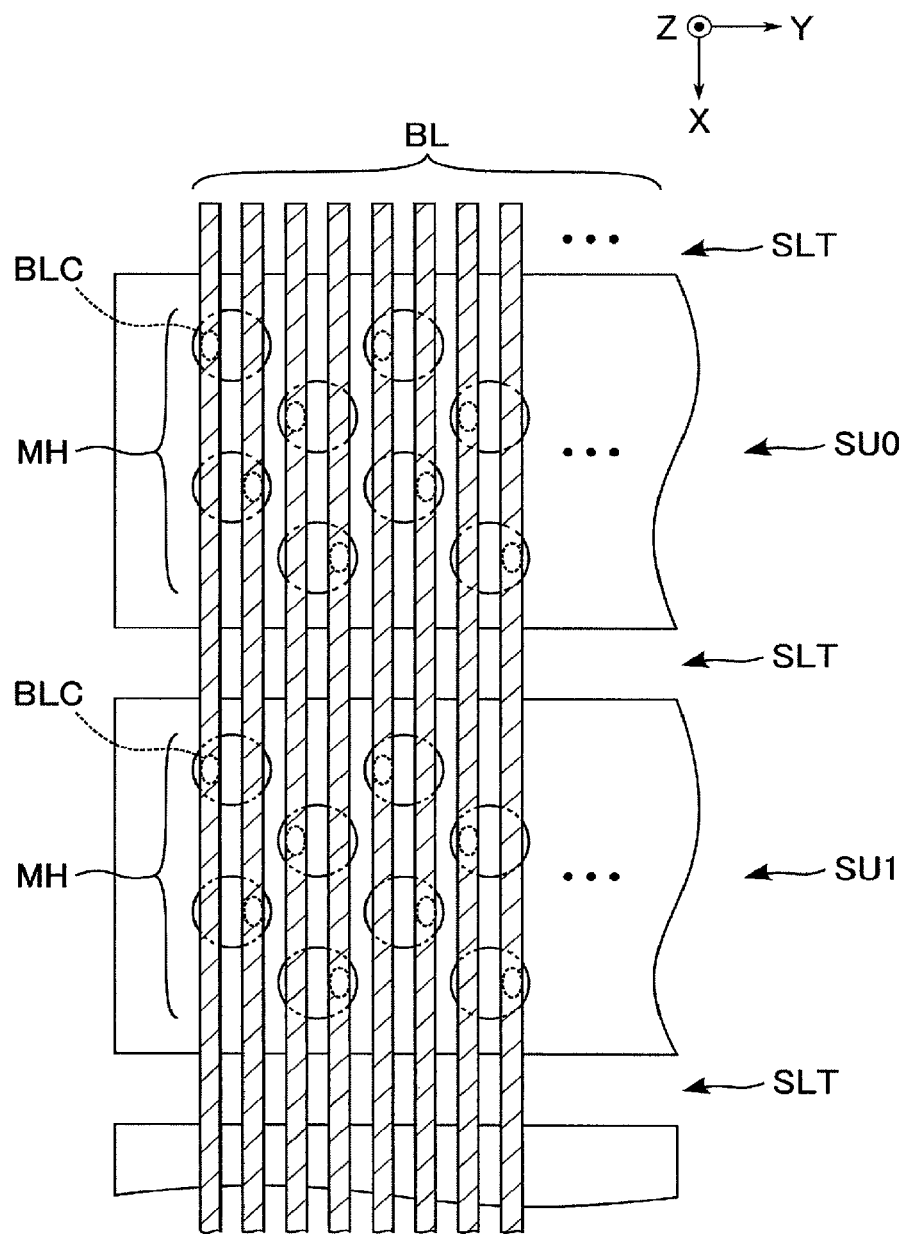
F I G. 3

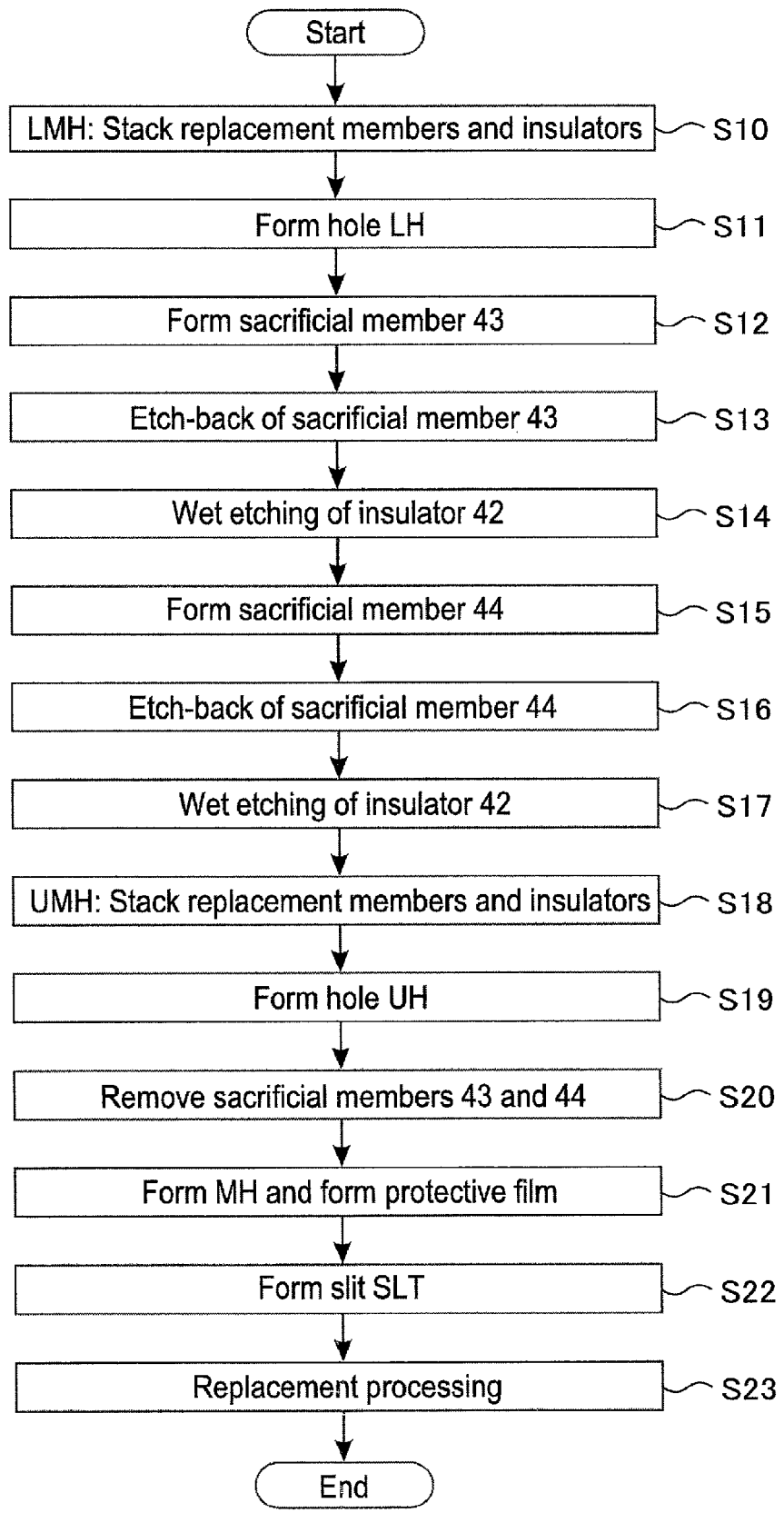
F I G. 6

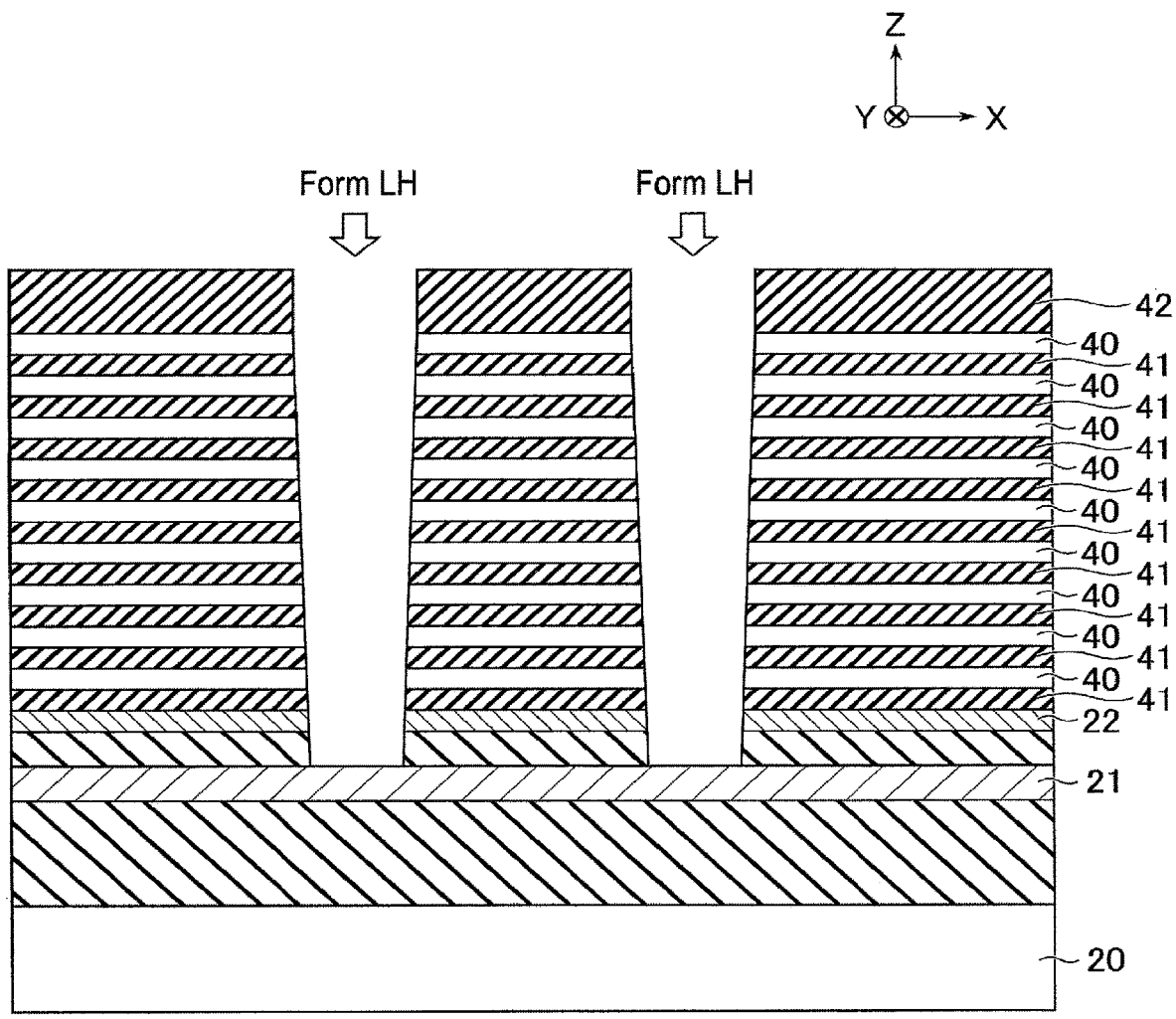
F I G. 9

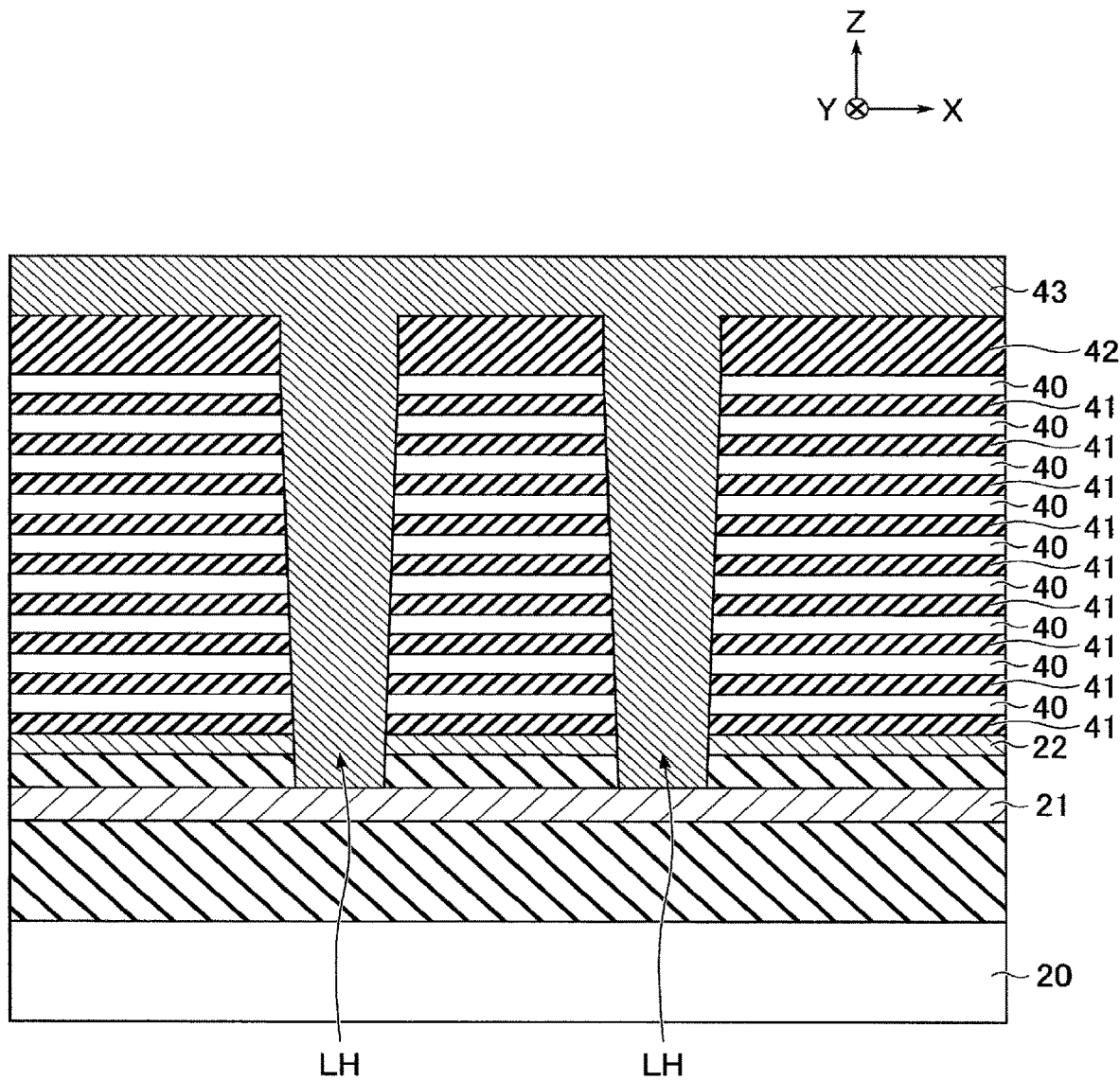
F I G. 10

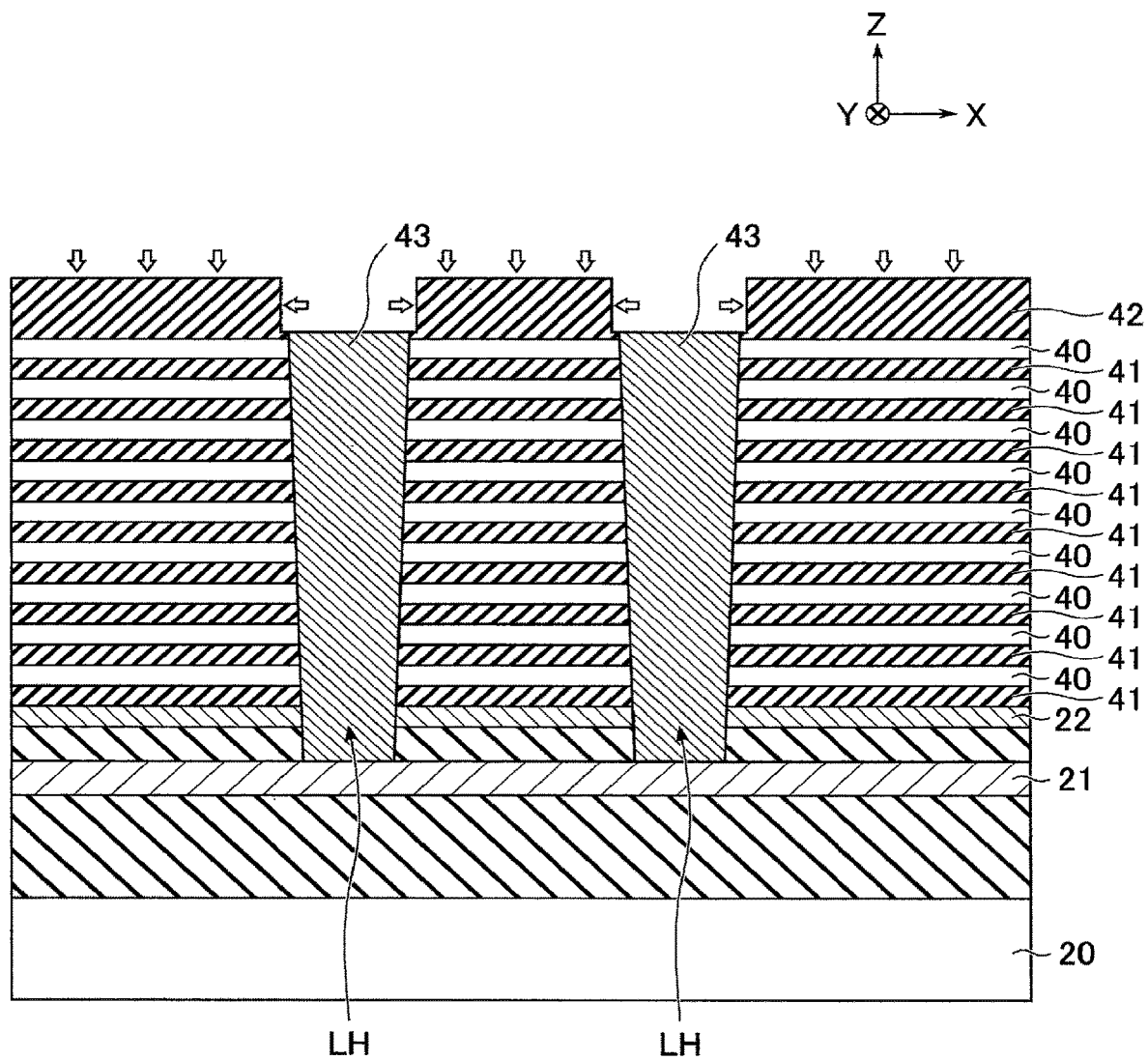
F I G. 12

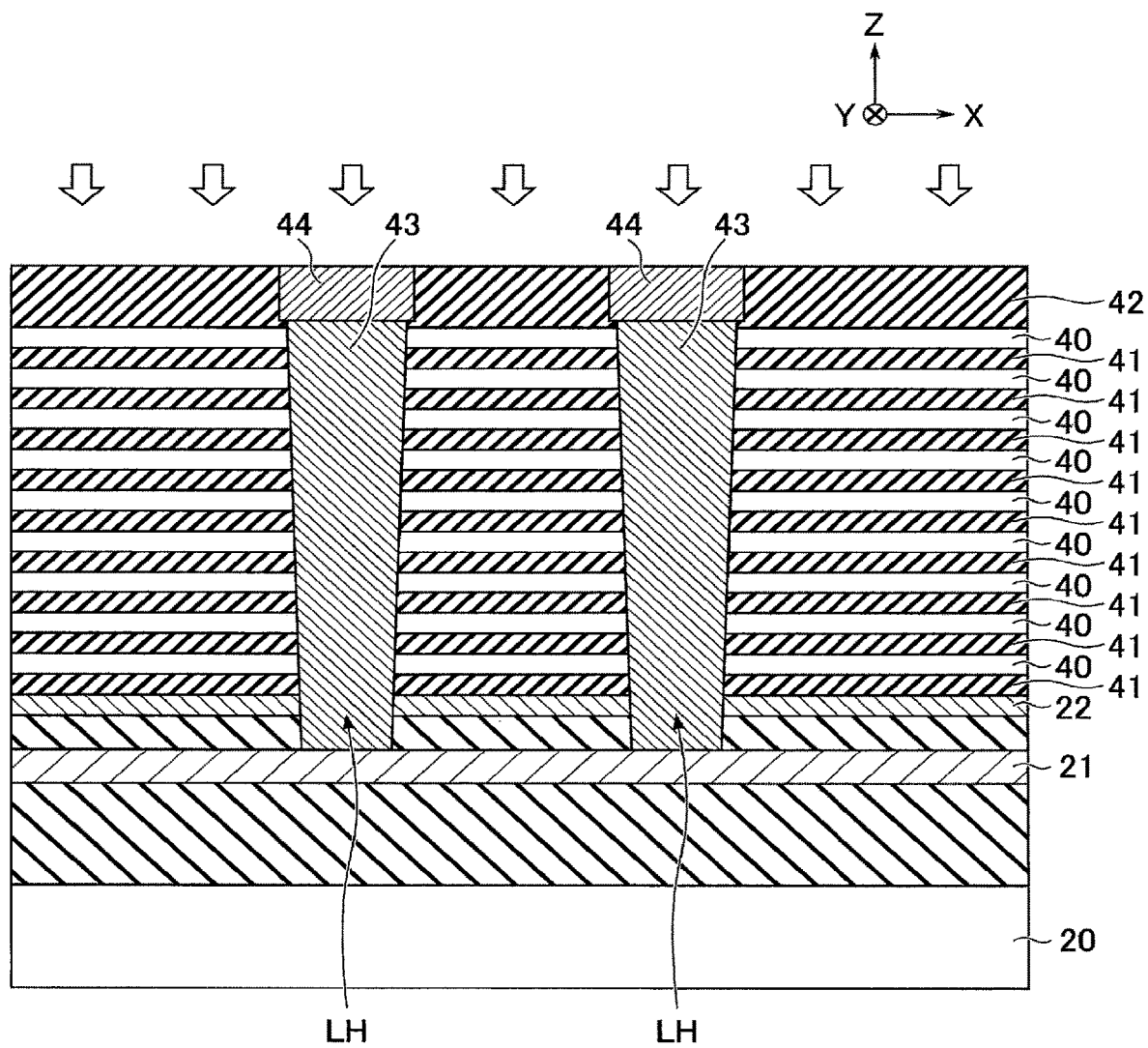
F I G. 14

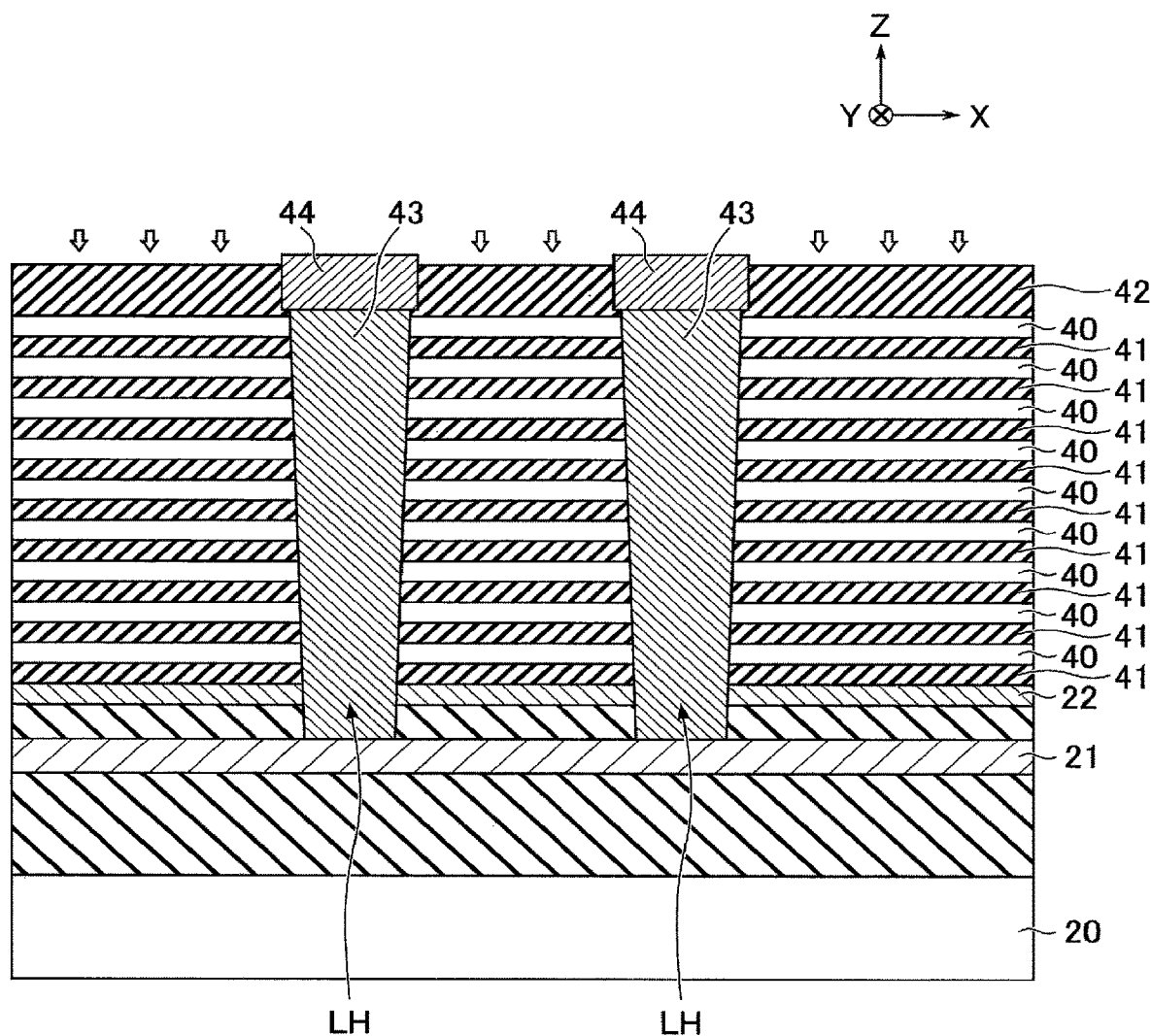
F I G. 15

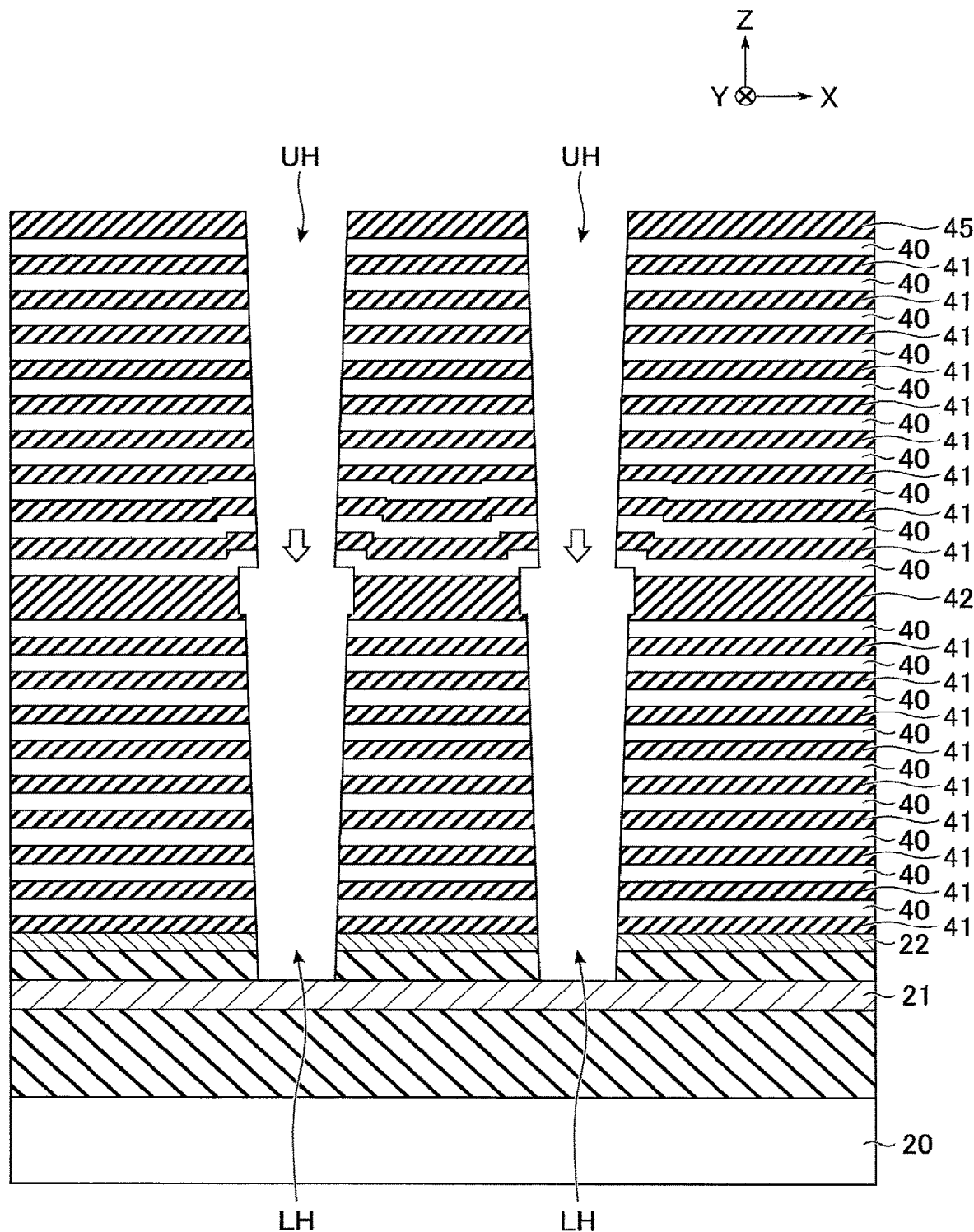
F I G. 18

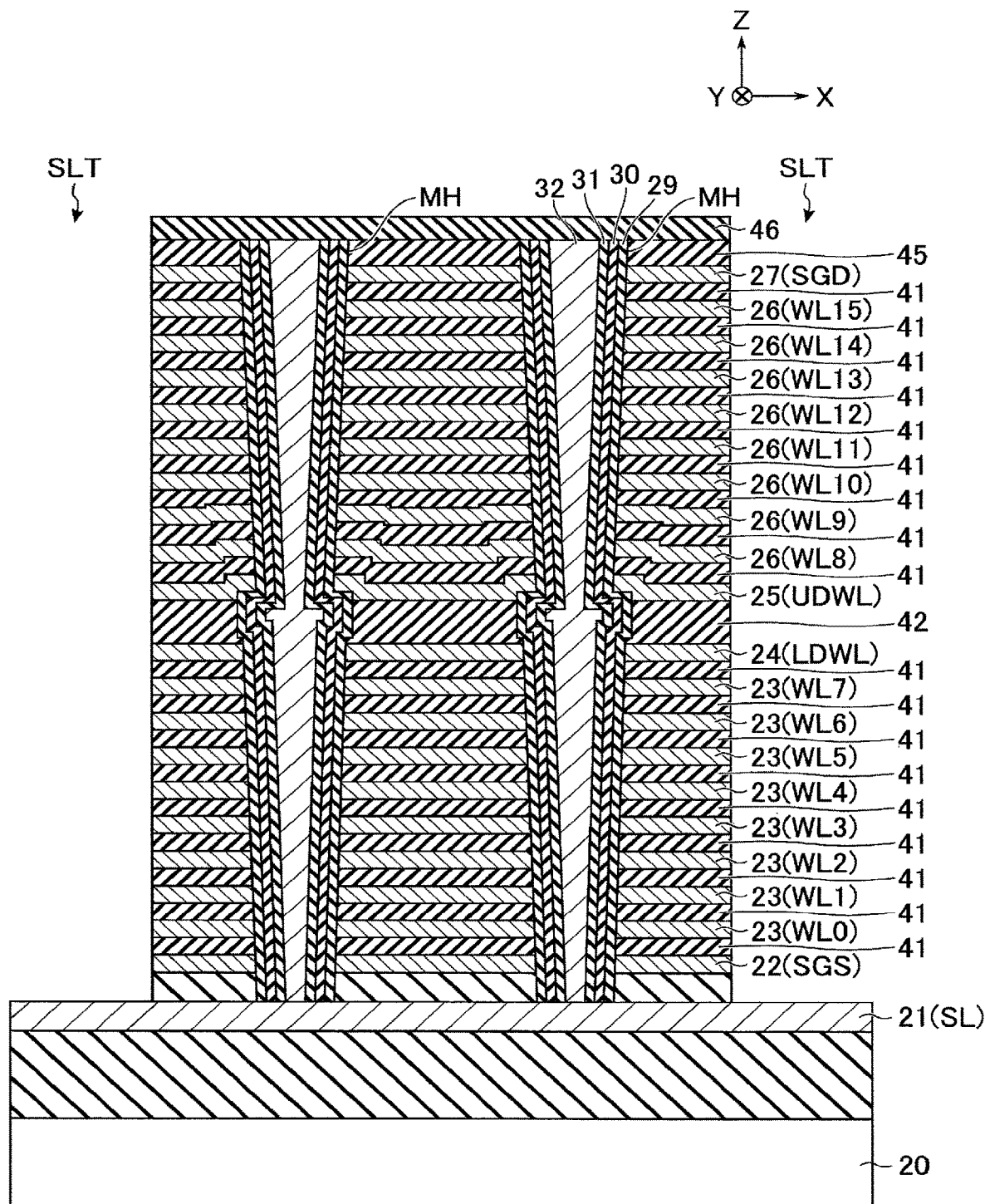
F I G. 21

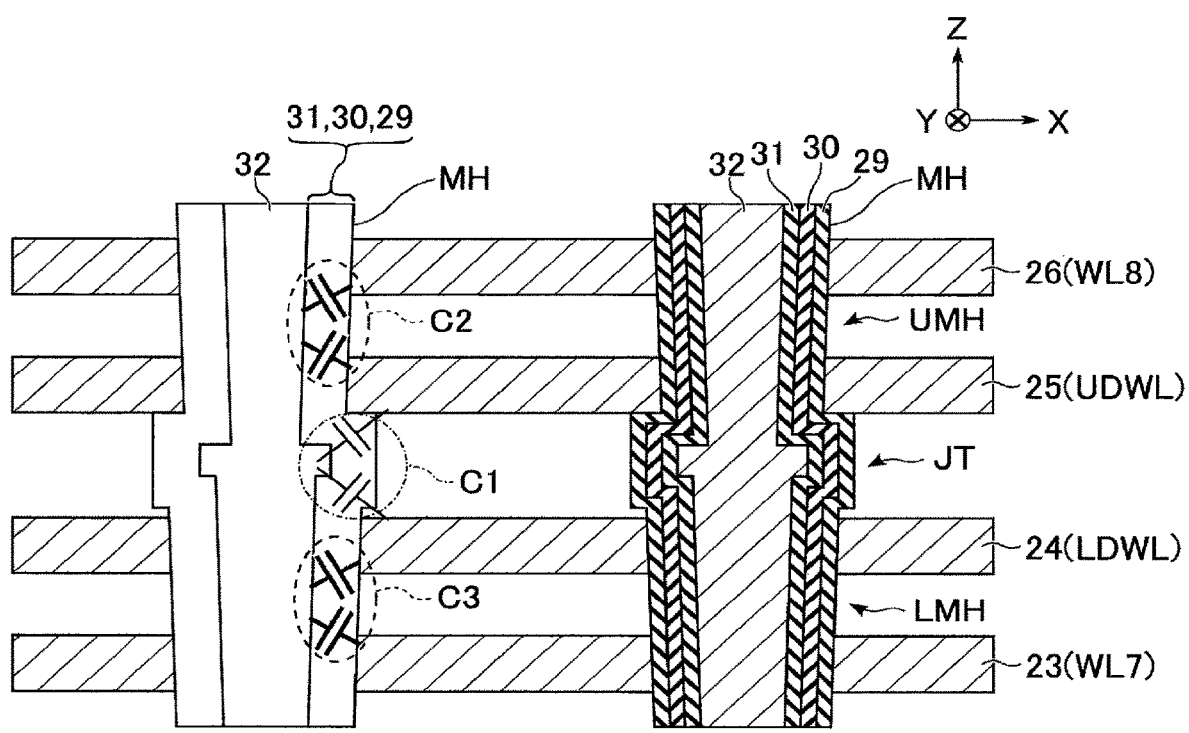
F I G. 22

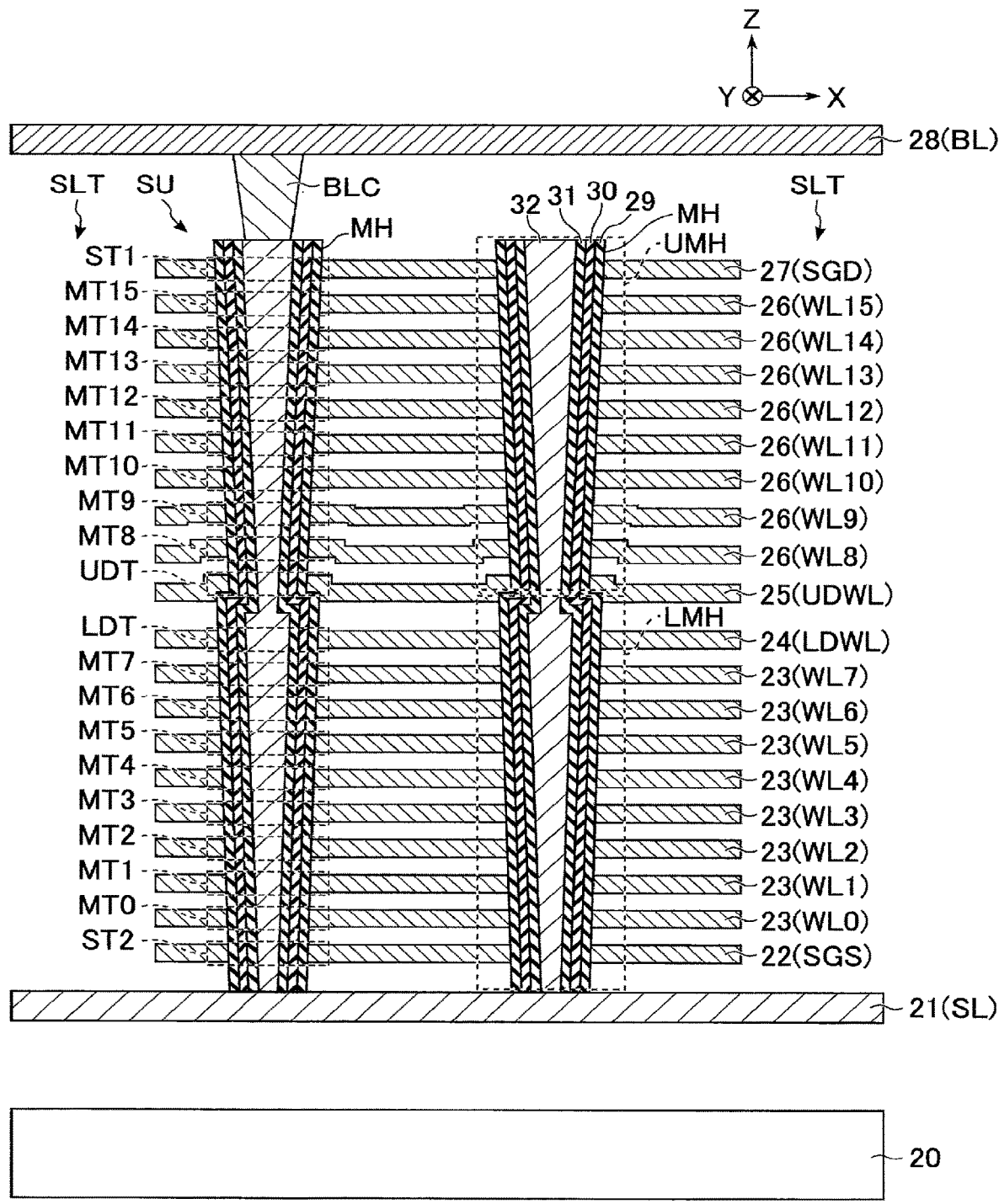
F I G. 23

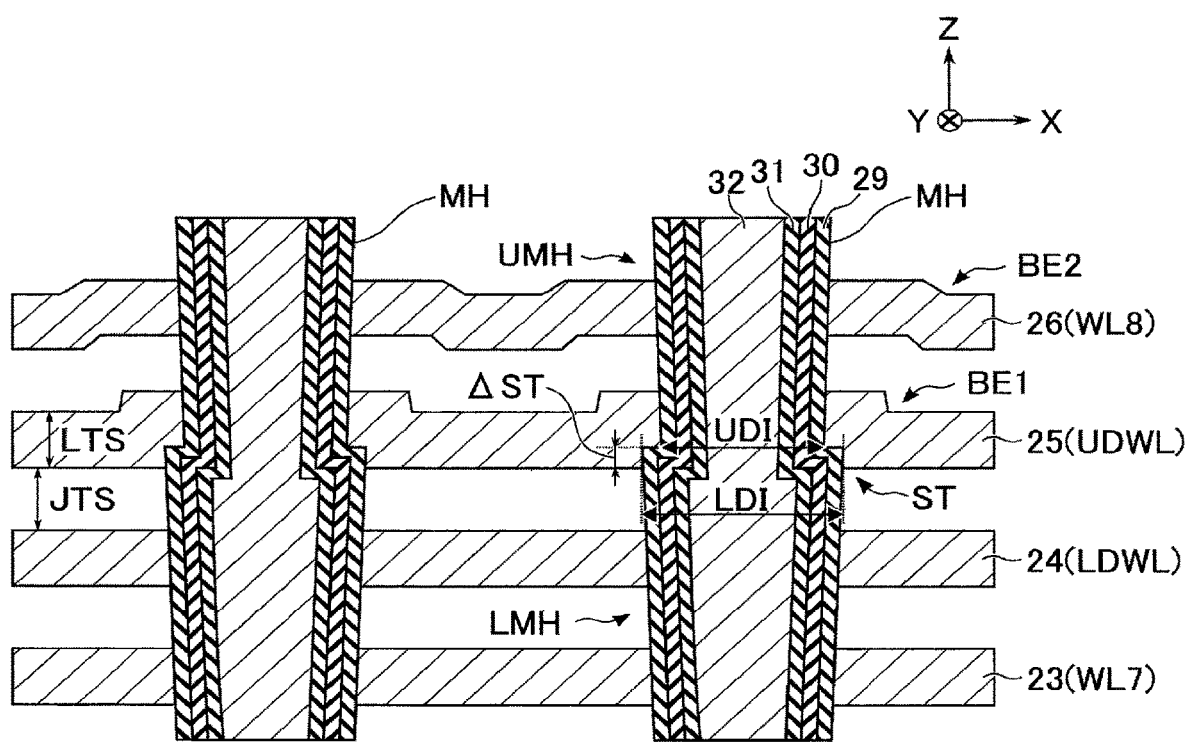
F I G. 24

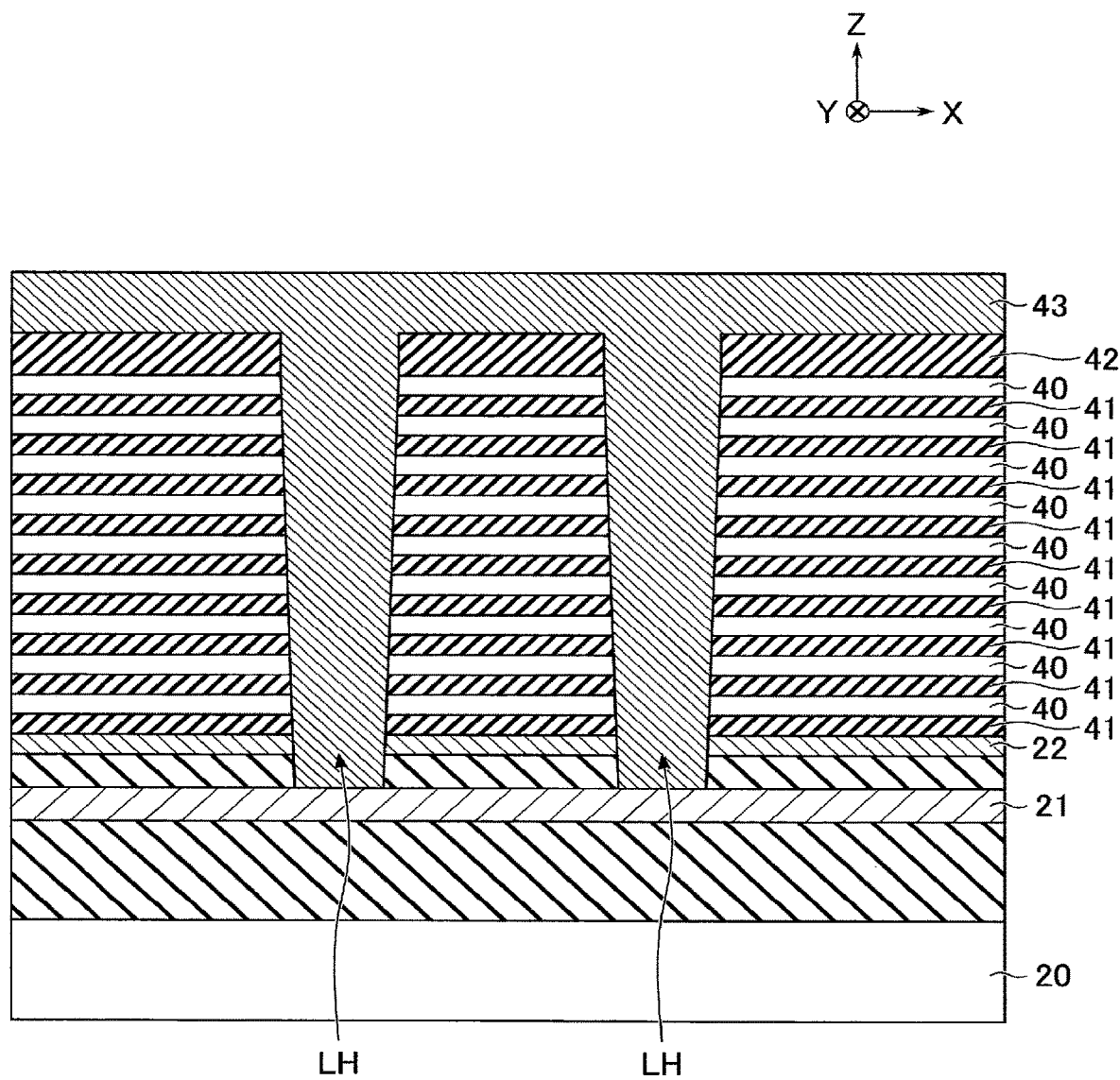
F I G. 26

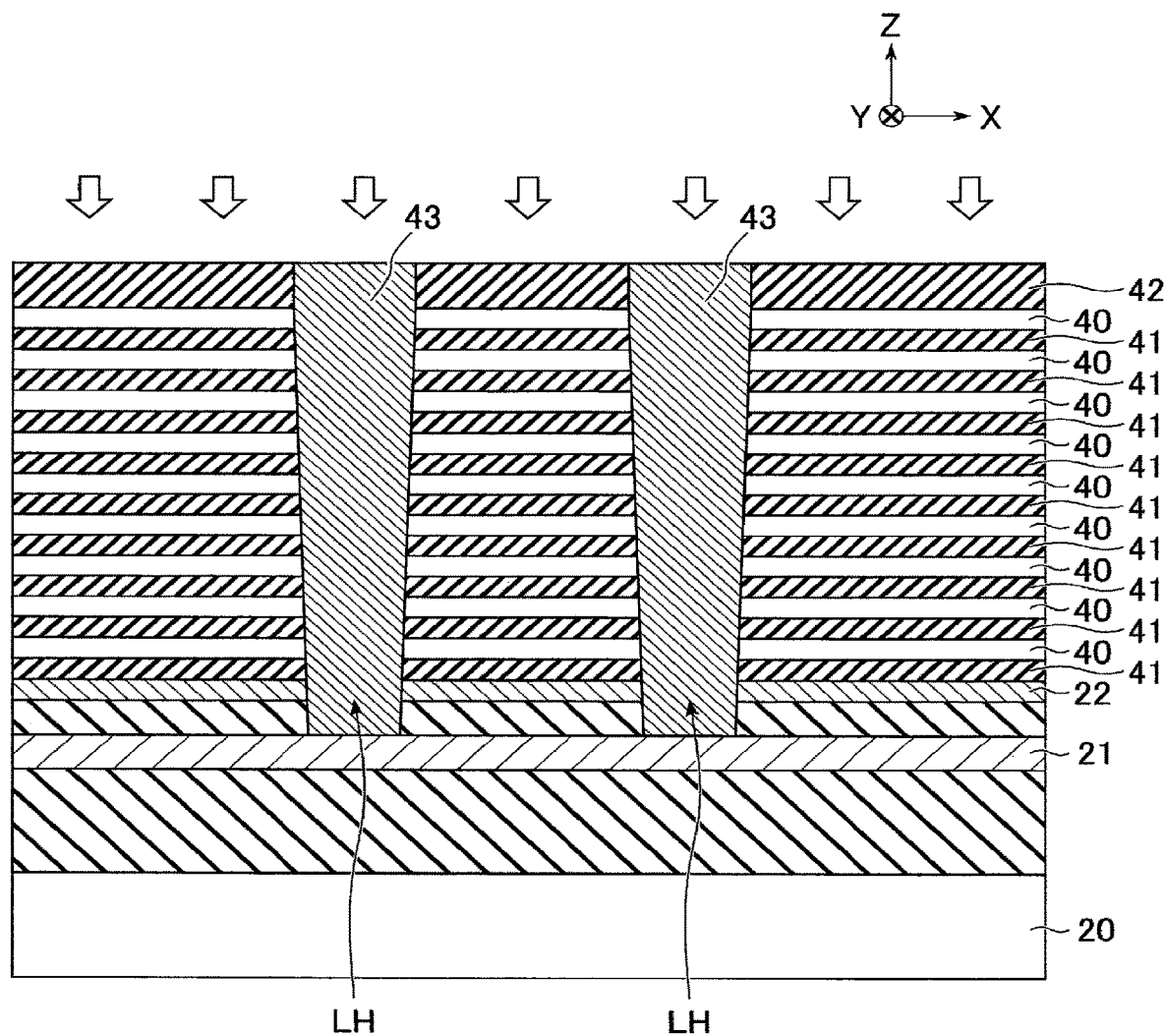
F I G. 27

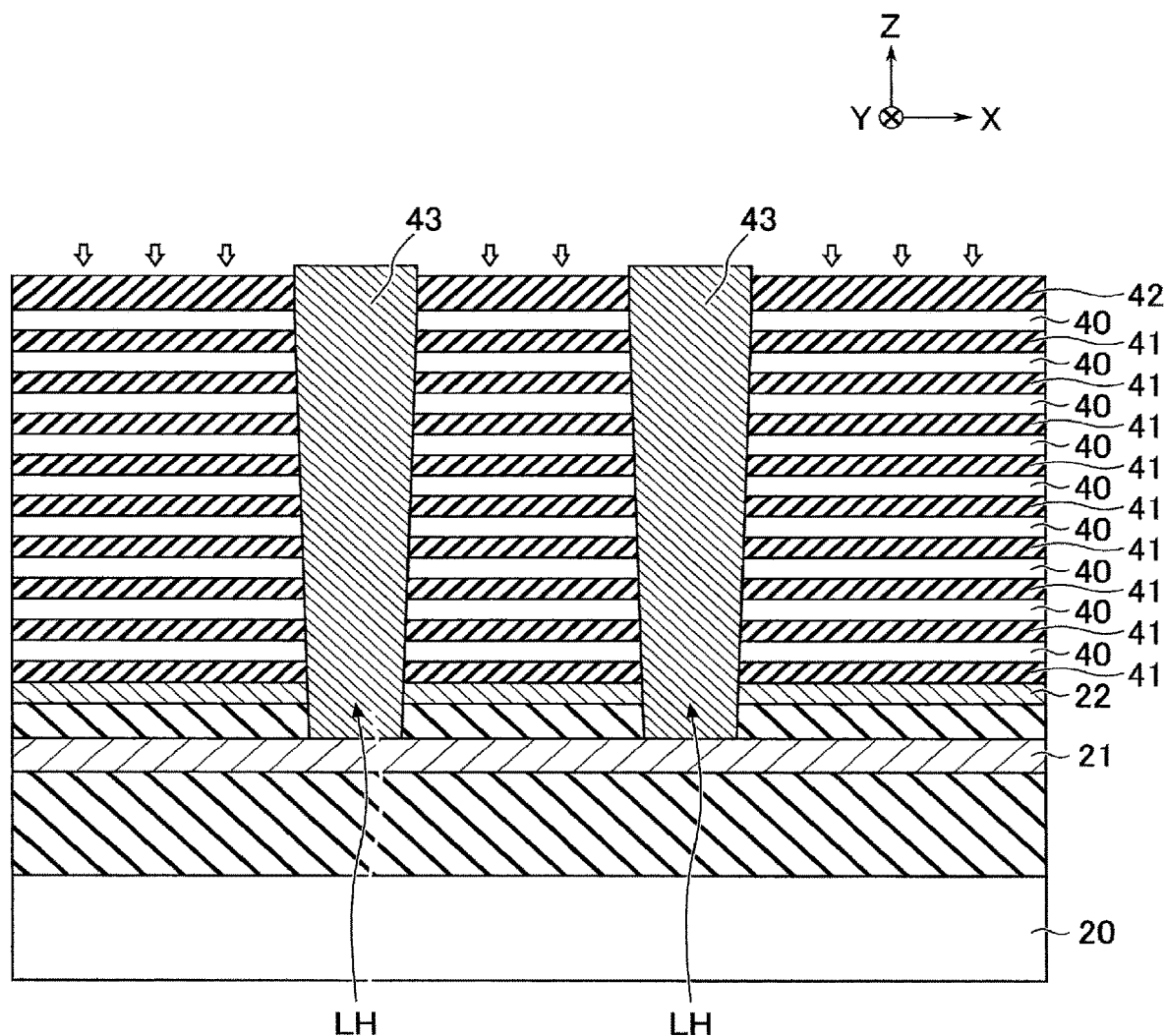
F I G. 28

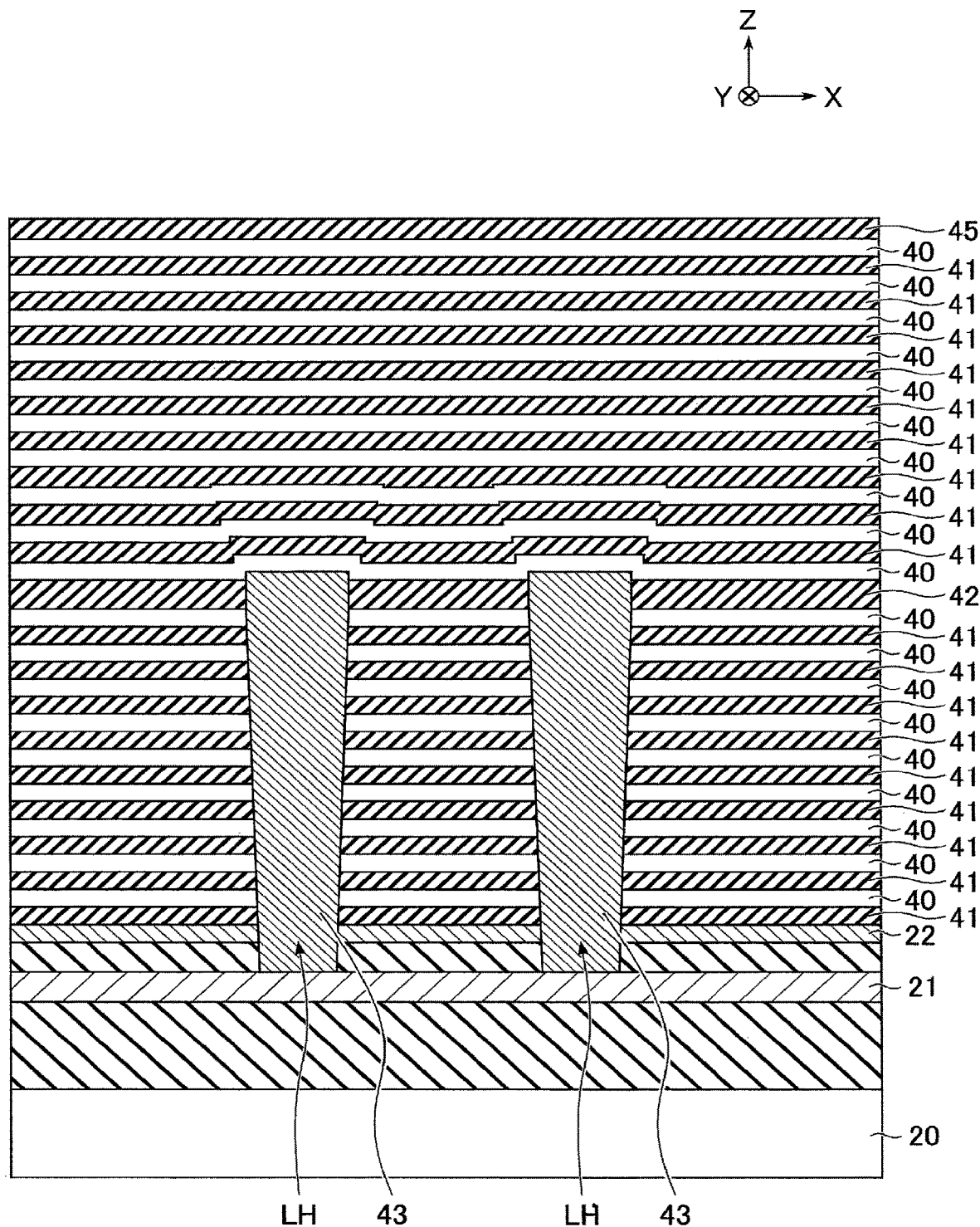
F I G. 29

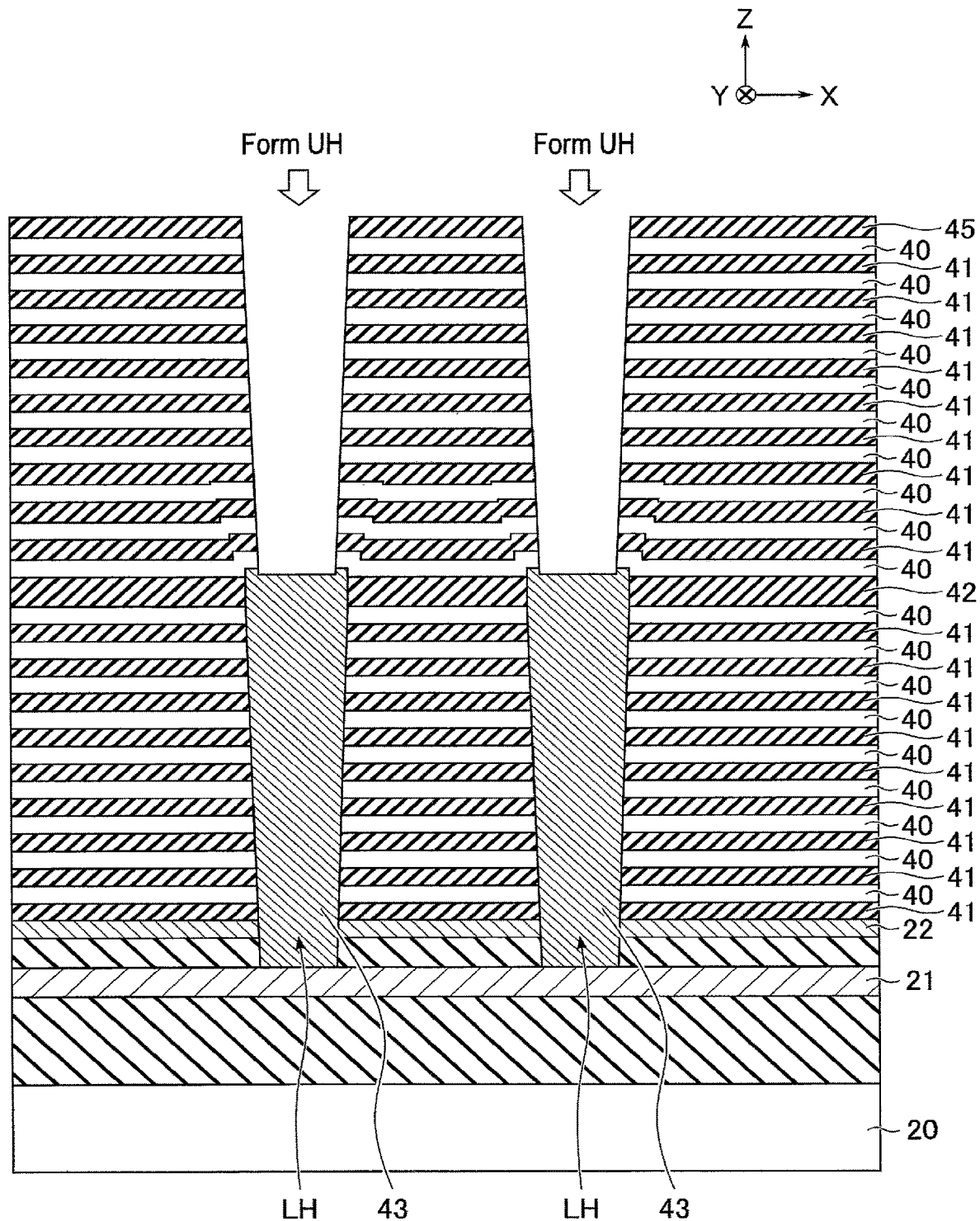
F I G. 30

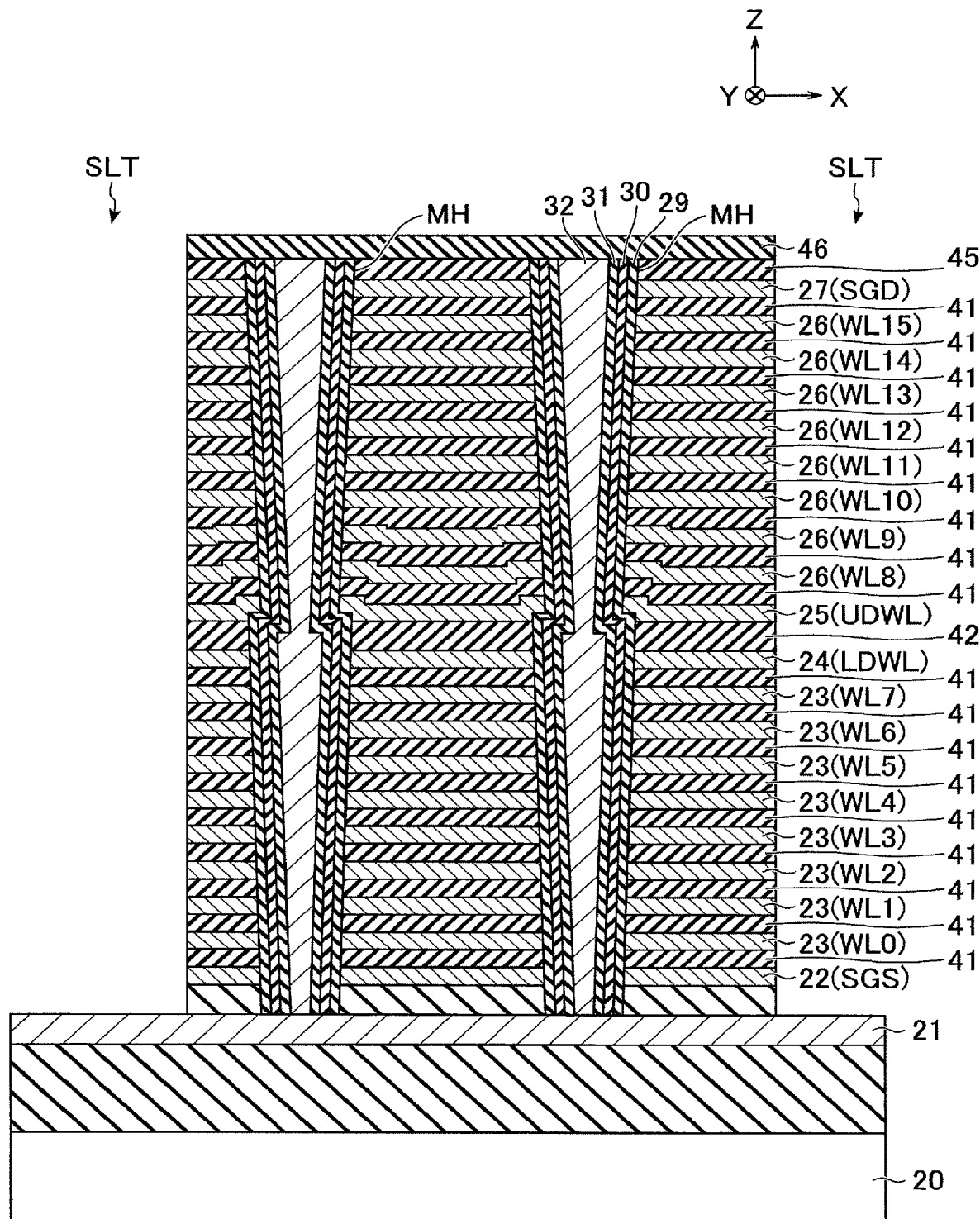
F I G. 34

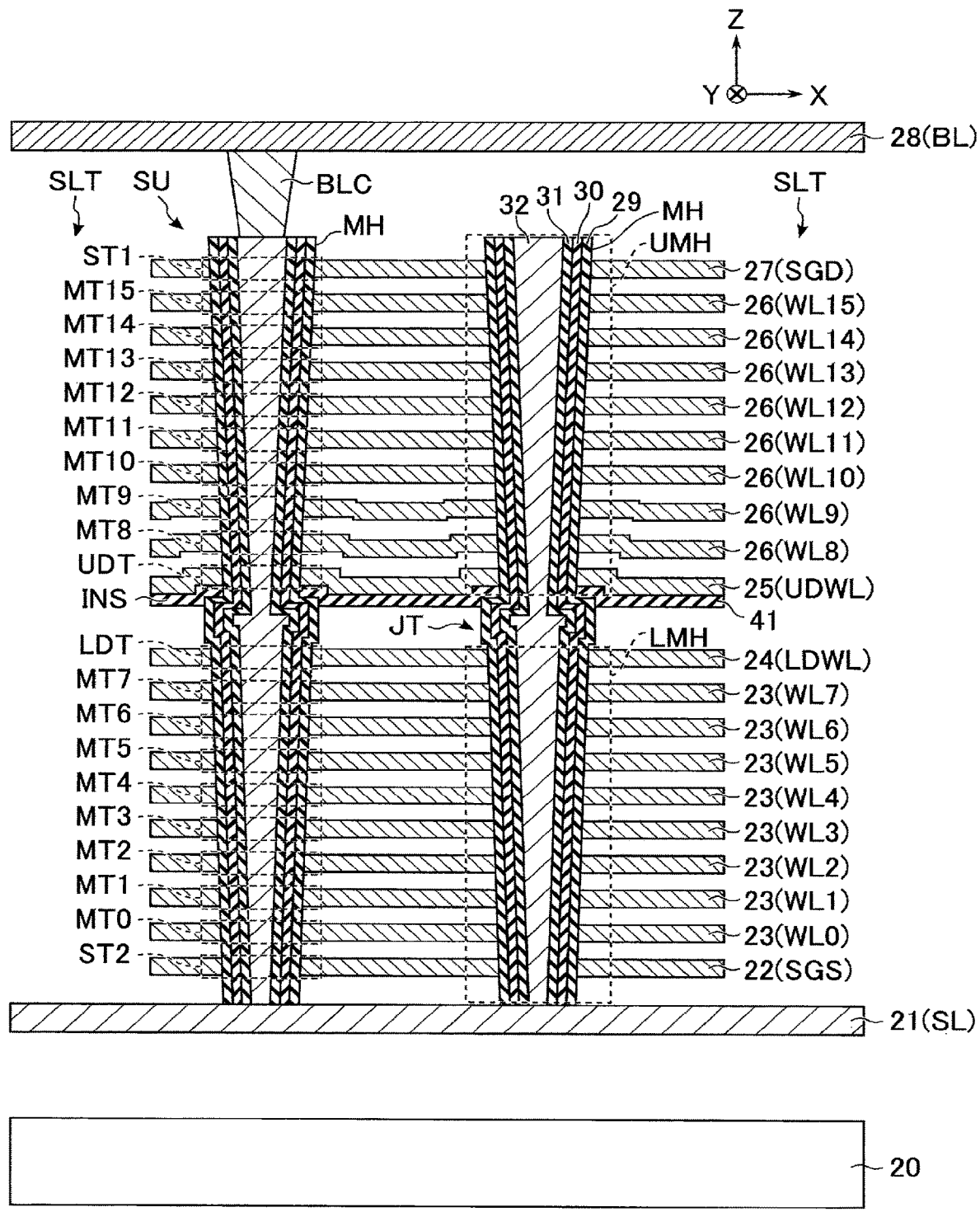
F I G. 35

THREE DIMENSIONAL SEMICONDUCTOR MEMORY INCLUDING PILLARS HAVING JOINT PORTIONS BETWEEN COLUMNAR SECTIONS

CROSS-REFERENCE TO RELATED APPLICATIONS

This application is a continuation of and claims the benefit of priority under 35 U.S.C. § 120 from U.S. application Ser. No. 16/118,567 filed Aug. 31, 2018, and claims the benefit of priority from Japanese Patent Application No. 2017-249588 filed Dec. 26, 2017, the entire contents of each of which are incorporated herein by reference.

FIELD

Embodiments described herein relate to a semiconductor memory.

BACKGROUND

A NAND-type flash memory, in which memory cells are three-dimensionally stacked, is known.

BRIEF DESCRIPTION OF THE DRAWINGS

FIG. 3 is a plan view showing an example of a planar layout of the memory cell array included in the semiconductor memory according to the first embodiment;

FIG. 6 is a flowchart showing an example of a manufacturing method of the semiconductor memory according to the first embodiment;

FIGS. 7, 8, 9, 10, 11, 12, 13, 14, 15, 16, 17, 18, 19, 20, and 21 are cross-sectional views of the memory cell array showing an example of steps of manufacturing the semiconductor memory according to the first embodiment;

FIG. 22 is a cross-sectional view of the memory cell array showing characteristics of a memory pillar in the first embodiment;

FIG. 23 is a cross-sectional view showing an example of a cross-section structure of a memory cell array included in a semiconductor memory according to a second embodiment;

FIG. 24 is a cross-sectional view showing an example of a detailed cross-section structure of the memory cell array included in the semiconductor memory according to the second embodiment;

FIGS. 26, 27, 28, 29, 30, 31, 32, 33, and 34 are cross-sectional views of the memory cell array showing an example of steps of manufacturing the semiconductor memory according to the second embodiment;

FIG. 35 is a cross-sectional view showing an example of a cross-section structure of a memory cell array according to a modification of the first embodiment;

DETAILED DESCRIPTION

A semiconductor memory of the embodiments includes a plurality of conductors stacked with insulators being interposed therebetween and a pillar passing through the plurality of conductors. The pillar includes a first columnar section, a second columnar section, and a joint portion between the first columnar section and the second columnar section. The pillar comprises portions that cross the respective conductors and that each function as part of a transistor. The plurality of conductors include a first conductor. The first conductor is closest to the joint portion among the plurality of conductors through the second columnar section, and includes a bending portion formed along the joint portion.

Hereinafter, the embodiments will be described with reference to the accompanying drawings. The drawings are schematic views. Each embodiment is an example of an apparatus or a method to embody a technical idea of the invention. In the description below, structural elements having substantially the same functions and configurations will be denoted by the same reference symbols. The numbers after the letters constituting the reference symbols are used to distinguish elements which are denoted by the reference symbols including the same letters and which have similar configurations. If there is no need of mutually distinguishing the elements which are denoted by the reference symbols that include the same letters, the same elements are denoted by the reference symbols that include only the same letters.

[1] First Embodiment

A semiconductor memory 1 according to a first embodiment will be described.
[1-1] Configuration
[1-1-1] Configuration of Semiconductor Memory 1

Figure 1:
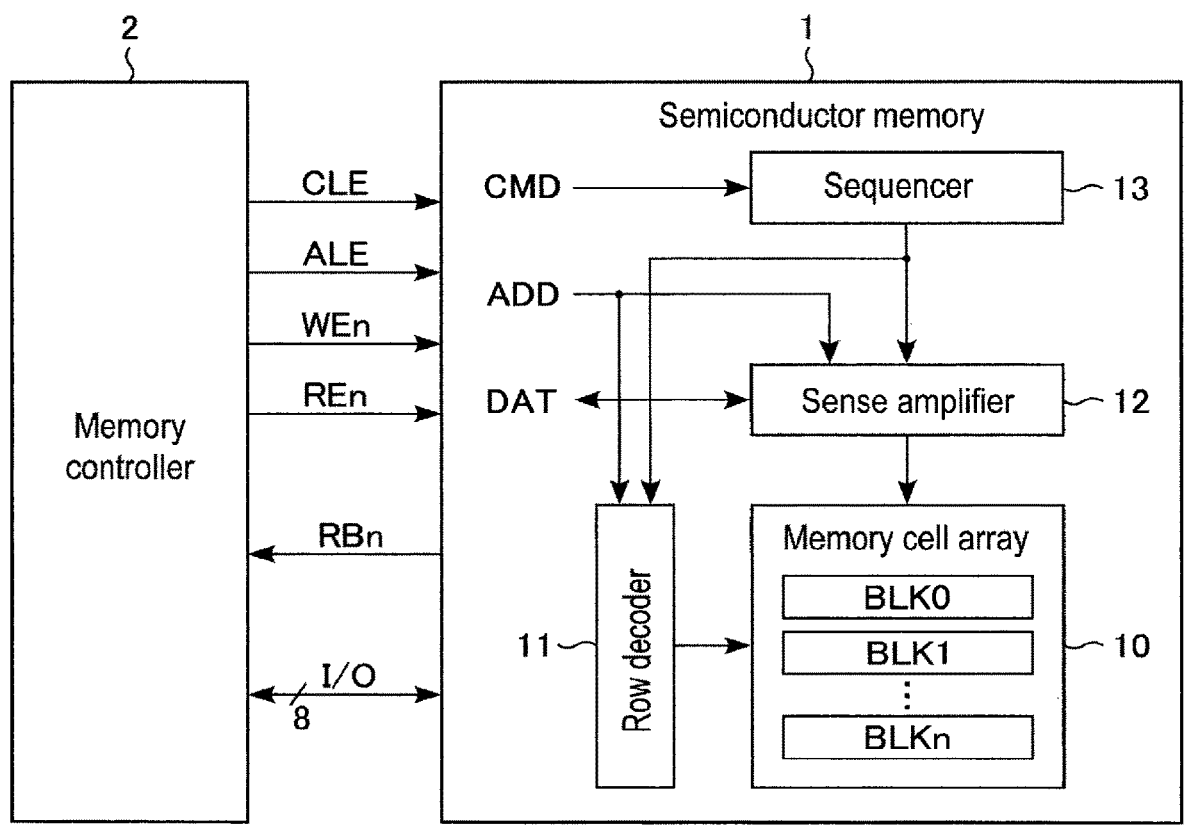
FIG. 1 is a block diagram showing a configuration example of a semiconductor memory according to a first embodiment.

FIG. 1 shows a configuration example of the semiconductor memory 1 according to the first embodiment. The semiconductor memory 1 is a NAND-type flash memory capable of storing data in a non-volatile manner. As shown in FIG. 1, the semiconductor memory 1 includes, for example, a memory cell array 10, a row decoder 11, a sense amplifier 12, and a sequencer 13.

The memory cell array 10 includes a plurality of blocks BLK0 through BLKn (n is an integer equal to or greater than 1). A block BLK is a group of non-volatile memory cells, and is, for example, a data erasure unit. The memory cell array 10 includes a plurality of bit lines and a plurality of word lines, and each memory cell is associated with one bit line and one word line. A detailed configuration of the memory cell array 10 will be described later.

The row decoder 11 selects one block BLK based on address information ADD received from an external memory controller 2. Then, the row decoder 11 applies each desired voltage to, for example, selected word lines and non-selected word lines.

The sense amplifier 12 applies each desired voltage to the bit lines on the basis of write data DAT received from the memory controller 2. The sense amplifier 12 also determines data stored in a memory cell based on a voltage of a bit line, and transmits determined read data DAT to the memory controller 2.

The sequencer 13 controls the operation of the entire semiconductor memory 1 based on the command CMD received from the memory controller 2. Communication between the semiconductor memory 1 and the memory controller 2 supports, for example, a NAND interface standard. For example, the memory controller 2 transmits a command latch enable signal CLE, an address latch enable signal ALE, a write enable signal WEn, and a read enable signal REn, receives a ready/busy signal RBn, and transmits and receives an input/output signal I/O.

The signal CLE is a signal notifying the semiconductor memory 1 that the received signal I/O is a command CMD. The signal ALE is a signal notifying the semiconductor memory 1 that the received signal I/O is address information ADD. The signal WEn is a signal instructing the semiconductor memory 1 to input the signal I/O. The signal REn is a signal instructing the semiconductor memory 1 to output the signal I/O. The signal RBn is a signal notifying the memory controller 2 whether the semiconductor memory 1 is in a ready state to receive an instruction from the memory controller 2 or in a busy state not to receive an instruction from the memory controller 2. The signal I/O is a signal of, for example, 8 bits, and may include a command CMD, address information ADD, data DAT, etc.

The semiconductor memory 1 and the memory controller 2 as described above may be combined to form one semiconductor device. Such a semiconductor device may be a memory card, such as an SD™ card, and an SSD (solid state drive), for example.

[1-1-2] Configuration of Memory Cell Array 10

(Circuit Configuration of Memory Cell Array 10)

Figure 2:
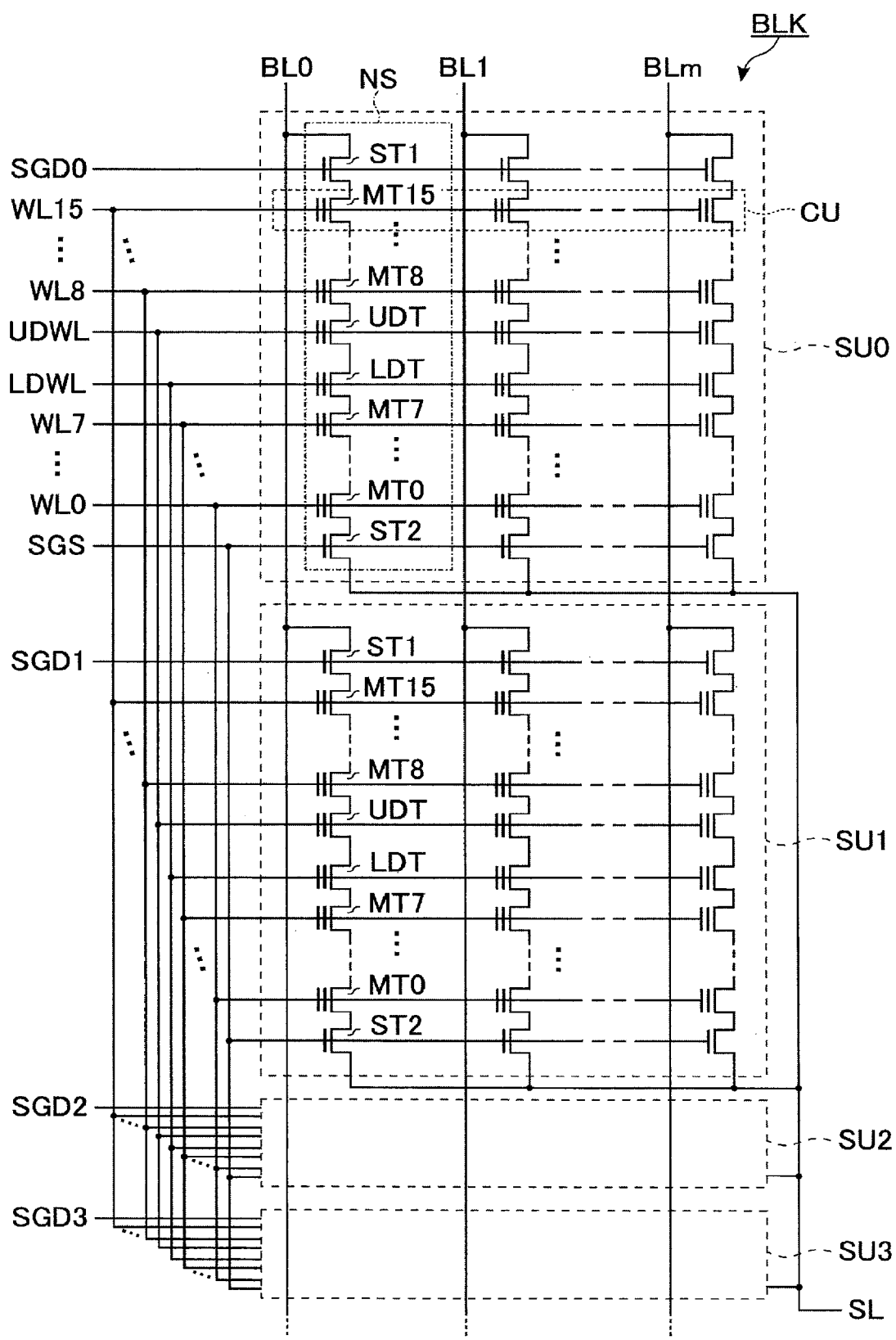
FIG. 2 is a circuit diagram showing an example of a circuit configuration of a memory cell array included in the semiconductor memory according to the first embodiment.

FIG. 2 shows an example of a circuit configuration of the memory cell array 10 according to the first embodiment, and focuses on one block BLK. The block BLK includes, for example, four string units SU (SU0 to SU3) as shown in FIG. 2.

Each string unit SU includes a plurality of NAND strings NS. The plurality of NAND strings NS are respectively associated with bit lines BL0 through BLm (m is an integer equal to or greater than 1). Each NAND string NS includes, for example, memory cell transistors MT0 through MT15, dummy transistors LDT and UDT, and select transistors ST1 and ST2.

Each memory cell transistor MT includes a control gate and a charge storage layer, and stores data in a non-volatile manner. Each of the dummy transistors LDT and UDT has a configuration similar to, for example, the configuration of the memory cell transistor MT, and is a memory cell transistor which is not used for storing data. Each of the select transistors ST1 and ST2 is used to select the string unit SU in various operations.

In each NAND string NS, the drain of a select transistor ST1 is coupled to a corresponding bit line BL. The memory cell transistors MT8 through MT15 are coupled in series between the source of the select transistor ST1 and the drain of the dummy transistor UDT. The source of the dummy transistor UDT is coupled to the drain of the dummy transistor LDT. The memory cell transistors MT0 through MT7 are coupled in series between the source of the dummy transistor LDT and the drain of the select transistor ST2. The source of the select transistor ST2 is coupled to a source line SL.

In one block BLK, the control gates of each of the memory cell transistors MT0 through MT15 are respectively coupled to word lines WL0 through WL15 in common. The control gates of the dummy transistors UDT are coupled to a dummy word line UDWL in common. The control gates of the dummy transistors LDT are coupled to a dummy word line LDWL in common. The gates of the select transistors ST1 included in each of the string units SU0 through SU3 are respectively coupled to selection gate lines SGD0 through SGD3 in common. The gates of the select transistors ST2 are coupled to a selection gate line SGS in common.

Different column addresses, for example, are respectively allocated to the bit lines BL0 through BLm, and each bit line BL couples select transistors ST1 of the NAND strings NS on the same column through the plurality of blocks BLK in common. The word lines WL0 through WL15 and the dummy word lines UDWL and LDWL, for example, are provided in each block BLK. The source line SL is shared by a plurality of blocks BLK.

In the following description, the plurality of memory cell transistors MT coupled to a common word line WL in one string unit SU are referred to as a "cell unit CU". The storage capacity of the cell unit CU changes on the basis of the number of bits of data stored in the memory cell transistors MT. For example, the cell unit CU stores one-page data if each of a plurality of memory cell transistors MT in the cell unit CU stores 1-bit data, and the cell unit CU stores two-page data if each of a plurality of memory cell transistors MT in the cell unit CU stores 2-bit data.

(Planar Layout of Memory Cell Array 10)

FIG. 3 shows an example of a planar layout of the memory cell array 10 in the first embodiment, an X axis, a Y axis, and a Z axis. Each of the plurality of string units SU extends in the Y direction and is arranged in the X direction, for example, as shown in FIG. 3.

Each string unit SU includes a plurality of memory pillars MH. The plurality of memory pillars MH are, for example, arranged in a staggered manner in the Y direction. At least one bit line BL, for example, is provided to overlap with each memory pillar MH. In each string unit SU, one memory pillar MH is coupled to one bit line BL via a contact plug BLC.

In the memory cell array 10, a plurality of slits SLT are provided. Each of the plurality of slits SLT, for example, extends in the Y direction and is arranged in the X direction. One string unit SU, for example, is provided between neighboring slits SLT. The number of string units SU provided between neighboring slits SLT is not limited to one, but may be determined as a given number.

(Cross-Section Structure of Memory Cell Array 10)

Figure 4:
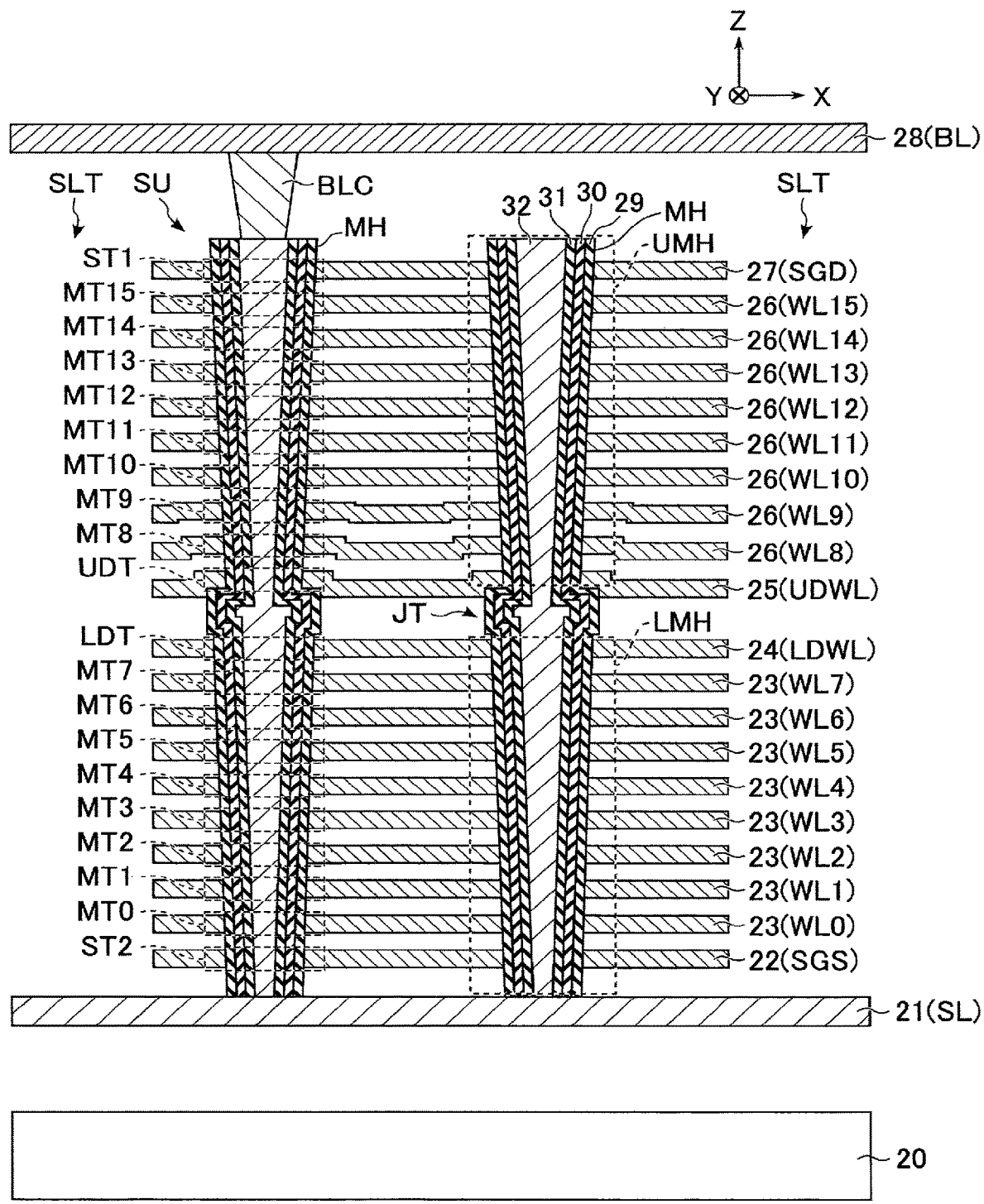
FIG. 4 is a cross-sectional view showing an example of a cross-section structure of the memory cell array included in the semiconductor memory according to the first embodiment.

FIG. 4 shows an example of a cross-section structure of the memory cell array 10 in the first embodiment, and shows a cross-section area of the memory cell array 10 in which interlayer insulation films are not shown, the X axis, the Y axis, and the Z axis. As shown in FIG. 4, the memory cell array 10 includes a semiconductor substrate 20, conductors 21 through 28, the memory pillars MH, and the contact plugs BLC.

The surface of the semiconductor substrate 20 is provided parallel to an XY plane. The conductor 21 is provided above the semiconductor substrate 20 with an insulation film being interposed therebetween. The conductor 21 is formed in a plate-like shape parallel to the XY plane, and functions as, for example, the source line SL. The plurality of slits SLT parallel to a YZ plane are arranged in the X direction on the conductor 21. The structures above the conductor 21 and between neighboring slits SLT corresponds to, for example, one string unit SU.

For example, a conductor 22, eight conductors 23, a conductor 24, a conductor 25, eight conductors 26, and a conductor 27 are provided on the conductor 21 and between neighboring slits SLT in this order from the side of the semiconductor substrate 20. The conductors adjacent to each other in the Z direction among these conductors are stacked with an interlayer insulation film being interposed therebetween. Each of the conductors 22 through 27 is formed in a plate-like shape parallel to the XY plane.

For example, the conductor 22 functions as the selection gate line SGS. The eight conductors 23 respectively function as the word lines WL0 to WL7 in the order from the bottom. The conductors 24 and 25 respectively function as the dummy word lines LDWL and UDWL. The eight conductors 26 respectively function as the word lines WL8 to WL15 in the order from the bottom. The conductor 27 functions as a selection gate line SGD.

Each of the plurality of memory pillars MH functions as, for example, one NAND string NS. Each memory pillar MH is provided to pass through the conductors 22 through 27 in a manner that each memory pillar MH extends from the upper surface of the conductor 27 to reach the upper surface of the conductor 21. Furthermore, each memory pillar MH is formed by connecting a plurality of columnar sections, and includes, for example, a lower pillar LMH, an upper pillar UMH, and a joint portion JT between the lower pillar LMH and the upper pillar UMH. The upper pillar UMH is provided above the lower pillar LMH, and the lower pillar LMH and the upper pillar UMH are joined to the joint portion JT interposed therebetween.

In addition, the memory pillar MH includes, for example, a block insulation film 29, an insulation film 30, a tunnel oxide film 31, and a conductive semiconductor material 32. The block insulation film 29 is provided on the inner wall of a memory hole forming the memory pillar MH. The insulation film 30 is provided on the inner wall of the block insulation film 29, and functions as a charge storage layer of the memory cell transistor MT. The tunnel oxide film 31 is provided on the inner wall of the insulation film 30. The semiconductor material 32 is provided on the inner wall of the tunnel oxide film 31, and a current pathway of the NAND string NS is formed in the semiconductor material 32. The memory pillar MH may include a different material inside the conductive semiconductor material 32.

The part where the memory pillar MH crosses the conductor 22 functions as the select transistor ST2. The parts where the memory pillar MH crosses the eight conductors 23 respectively function as the memory cell transistors MT0 through MT7 in this order from the bottom. The part where the memory pillar MH crosses the conductor 24 functions as the dummy transistor LDT. As shown in the drawing, the select transistor ST2, the memory cell transistors MT0 through MT7, and the dummy transistor LDT are each formed by the lower pillar LMH.

The part where the memory pillar MH crosses the conductor 25 functions as the dummy transistor UDT. The parts where the memory pillar MH crosses the eight conductors 26 respectively function as the memory cell transistors MT8 through MT15 in this order from the bottom. The part where the memory pillar MH crosses the conductor 27 functions as the select transistor ST1. As shown in the drawing, the dummy transistor UDT, the memory cell transistors MT8 through MT15, and the select transistor ST1 are each formed by the upper pillar UMH.

Figure 5:
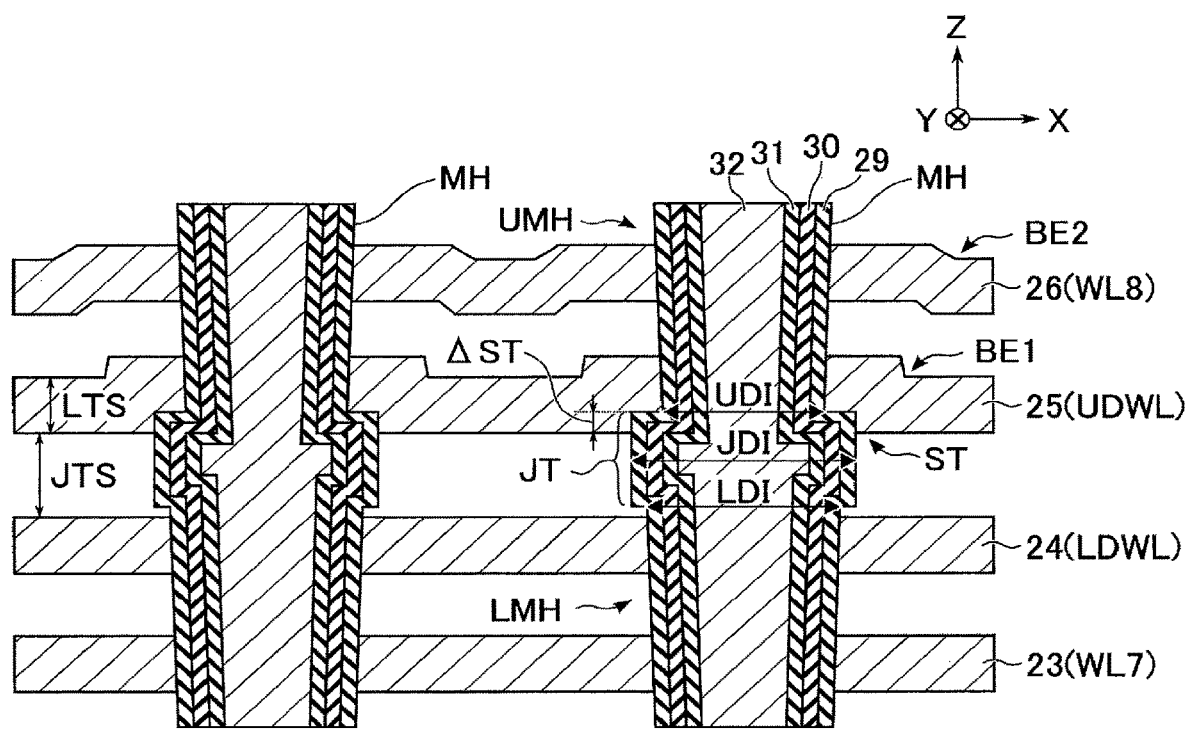
FIG. 5 is a cross-sectional view showing an example of a detailed cross-section structure of the memory cell array included in the semiconductor memory according to the first embodiment.

FIG. 5 shows an example of a detailed cross-section structure of the memory cell array 10, focusing on an area including the joint portion JT. As shown in FIG. 5, an outer diameter JDI of the joint portion JT in a cross-section area parallel to the XY plane is larger than an outer diameter LDI of the lower pillar LMH in a cross-section area parallel to an XY plane which includes a boundary portion between the lower pillar LMH and the joint portion JT, and is larger than an outer diameter UDI of the upper pillar UMH in a cross-section area parallel to the XY plane which includes a boundary portion between the upper pillar UMH and the joint portion JT. The term "outer diameter" in this specification indicates the outer diameter of the block insulation film 29 in the memory pillar MH.

For example, the conductor 24 (the dummy word line LDWL), through which the lower pillar LMH passes and that is provided next to the joint portion JT, does not have a portion bending along the joint portion JT. On the other hand, the conductor 25 (the dummy word line UDWL), through which the upper pillar UMH passes and that is provided next to the joint portion JT, has a portion BE1 bending along the shape of the joint portion JT.

The conductor 26 (the word line WL8), through which the upper pillar UMH passes and that is provided next to the conductor 25, has a portion BE2 bending indirectly along the shape of the joint portion JT. In other words, the conductor 26 bends along the portion where the conductor 25 bends along the joint portion JT. In this case, a bending amount of the conductor 25 (the dummy word line UDWL) at the portion BE1 is larger than a bending amount of the conductor 26 (the word line WL8) at the portion BE2.

The portion where the conductor 25 bends along the joint portion JT and directly or indirectly comes into contact with the joint portion JT is hereinafter called a bending portion ST. At the bending portion ST, an insulation film different from the block insulation film 29 may be provided between the joint portion JT and the conductor 25.

The bending portion ST is formed by a diameter difference between the outer diameter UDI and the outer diameter JDI. A height ΔST indicates the size of the bending portion ST in the Z direction. Specifically, the height ΔST is defined by, for example, the distance in the Z direction between a cross-section area, which is parallel to the XY plane and includes a portion of the bending portion ST which is the most distant from the semiconductor substrate 20 in the Z direction, and a cross-section area, which is parallel to the XY plane and includes a portion of the bending portion ST which is the closest to the semiconductor substrate 20 in the Z direction.

Furthermore, the height ΔST is determined to be, for example, smaller than a thickness LTS of the conductor 25 in the Z direction, and is preferably determined to be equal to or smaller than a half of the thickness LTS. The thickness LTS of the conductor 25 is preferably measured by using an area of the conductor 25 which does not include the bending portion ST.

A distance JTS in the Z direction between the conductors 24 and 25 is determined to be, for example, larger than the distance between adjacent conductors 23 in the Z direction, and larger than the distance between adjacent conductors 26 in the Z direction.

For example, the plurality of memory pillars MH include a first pillar and a second pillar adjacent to each other.

A distance in the Z direction between the semiconductor substrate 20 and an upper end of the conductor 25 at a position between the first and second pillars is smaller than a distance in the Z direction between the semiconductor substrate 20 and an upper end of a portion where the conductor 25 comes into contact with the first pillar.

A distance in the Z direction between the semiconductor substrate 20 and an upper end of the conductor 24 at a position between the first and second pillars is approximately equal to a distance in the Z direction between the semiconductor substrate 20 and an upper end of a portion where the conductor 24 comes into contact with the first pillar.

a distance in the Z direction between the semiconductor substrate 20 and an upper end of a conductor 26 distant from the conductor 25 at a position between the first and second pillars is approximately equal to a distance in the Z direction between the semiconductor substrate 20 and an upper end of a portion where said conductor 26 comes into contact with the first pillar.

Referring back to FIG. 4, the conductor 28 is provided above the upper surface of the memory pillar MH with an interlayer insulation film interposed there between. The conductor 28 is formed in a linear shape extending in the X direction, and functions as the bit line BL. A plurality of conductors 28 are arranged in the Y direction (not shown), and each conductor 28 is electrically coupled to one corresponding memory pillar MH in each string unit SU.

Specifically, in each string unit SU, for example, the conductive contact plug BLC is provided on the semiconductor material 32 in each memory pillar MH, and one conductor 28 is provided on the contact plug BLC. The memory pillar MH and the conductor 28 may be coupled via a plurality of contact plugs, wires, etc.

The configuration of the memory cell array 10 is not limited to the configuration described above. For example, the number of string units SU included in each block BLK may be determined as a given number. Each of the numbers of the memory cell transistors MT, dummy transistors UDT and LDT, and select transistors ST1 and ST2 that are included in each NAND string NS may be determined as a given number.

The number of each of the word lines WL, the dummy word lines UDWL and LDWL, and the selection gate lines SGD and SGS is changed based on the number of each of the memory cell transistors MT, the dummy transistors UDT and LDT, and the select transistors ST1 and ST2, respectively. A plurality of conductors 22 provided as a plurality of layers may be allocated to the selection gate line SGS, and a plurality of conductors 27 provided as a plurality of layers may be allocated to the selection gate line SGD.

As for the other configurations of the memory cell array 10, they are described in, for example, U.S. patent application Ser. No. 12/407,403 filed on Mar. 19, 2009 and entitled "THREE-DIMENSIONALLY STACKED NONVOLATILE SEMICONDUCTOR MEMORY," U.S. patent application Ser. No. 12/406,524 filed on Mar. 18, 2009 and entitled "THREE-DIMENSIONALLY STACKED NON-VOLATILE SEMICONDUCTOR MEMORY", U.S. patent application Ser. No. 12/679,991 filed on Mar. 25, 2010 and entitled "NON-VOLATILE SEMINCONDUCTOR STORAGE DEVICE AND METHOD OF MANUFACTURING THE SAME", and U.S. patent application Ser. No. 12/532,030 filed on Mar. 23, 2009 and entitled "SEMICONDUCTOR MEMORY AND MANUFACTURING METHOD THEREOF". The entire contents of these applications are incorporated herein by reference.

[1-2] Manufacturing Method

FIG. 6 shows an example of a manufacturing process of the semiconductor memory 1 according to the first embodiment. FIG. 7 through FIG. 21 show an example of cross-section structures insteps of manufacturing the memory cell array 10. In the following, a process starting from the step of stacking replacement members and insulators for forming word lines WL, etc. to the step of forming the word lines WL, will be described with reference to FIG. 6.

Figure 7:
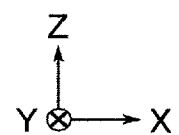
Figure 7:
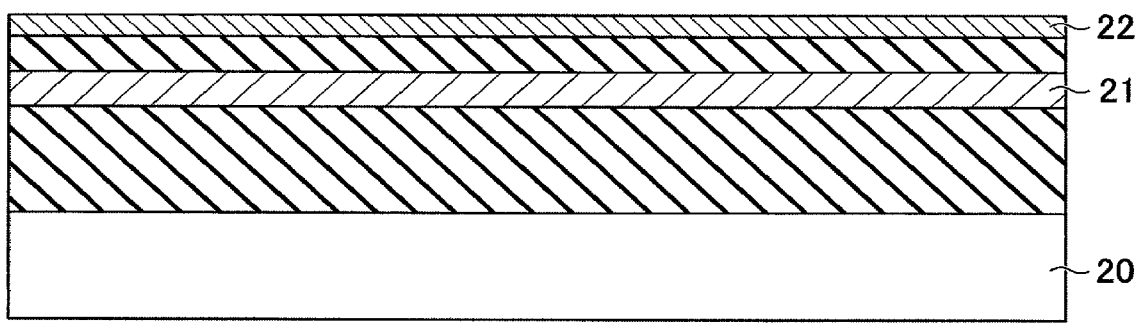

The description of manufacturing steps starts from, for example, a structure halfway through manufacture of the semiconductor memory 1 shown in FIG. 7. As shown in FIG. 7, the conductor 21 is formed on the semiconductor substrate 20 with an insulator being interposed therebetween. A control circuit, etc. (not shown) of the semiconductor memory 1 is formed between the semiconductor substrate 20 and the conductor 21. The conductor 22 is formed on the conductor 21 with an insulator being interposed therebetween.

Figure 8:
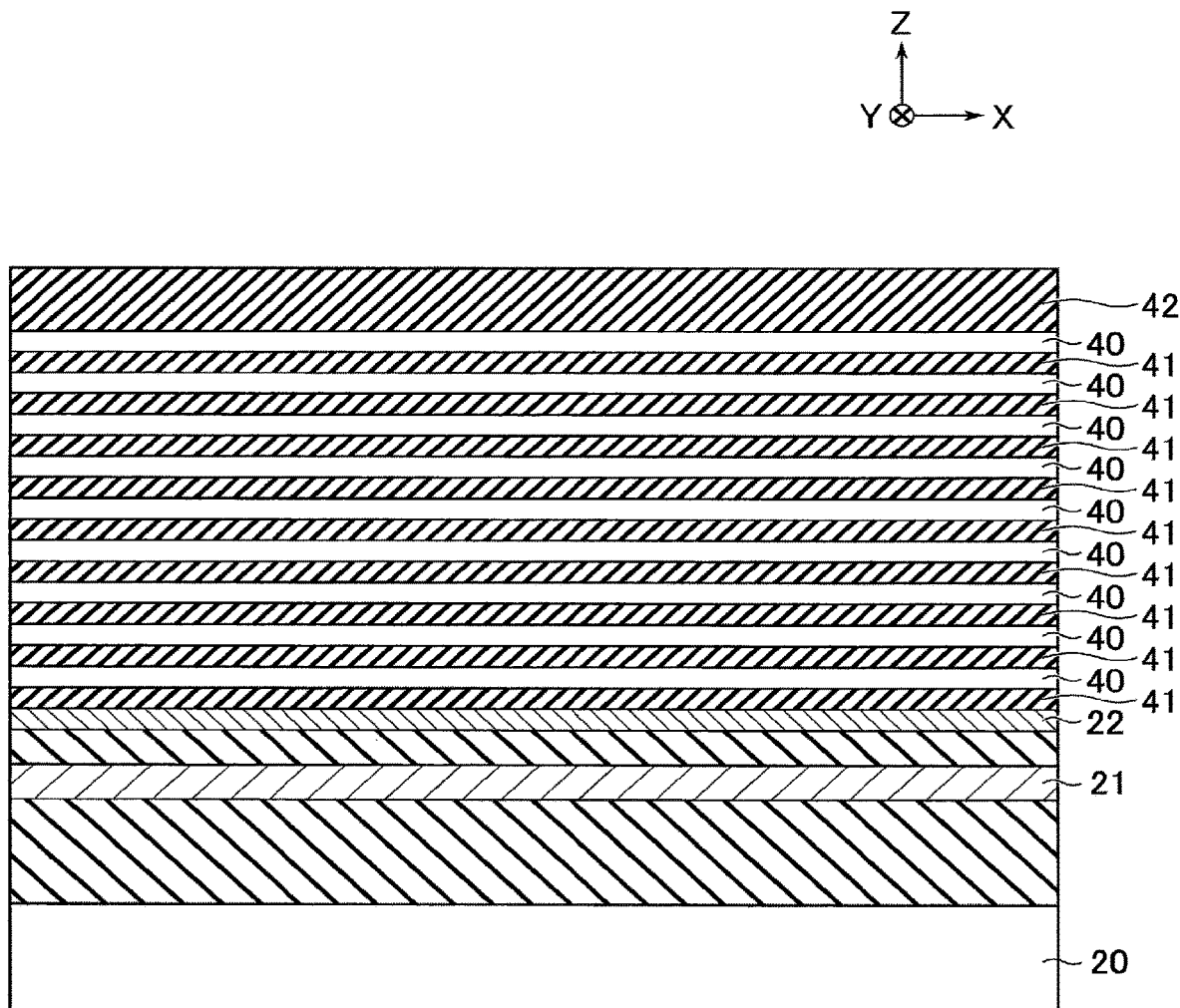

In step S10, as shown in FIG. 8, insulators 41 and replacement members 40 are alternately stacked on the conductor 22. For example, nitride films such as silicon nitride SiN are used as the replacement members 40, and oxide films such as silicon oxide $SiO_2$ are used as the insulators 41. The number of layers in which the replacement members 40 are formed corresponds to the number of word lines WL and the dummy word line LDWL corresponding to the lower pillar LMH. The replacement members 40 respectively correspond to the word lines WL0 through WL7 and the dummy word line LDWL in this order from the bottom. An insulator 42 is stacked on the uppermost replacement member 40. A layer thickness of the insulator 42 is larger than a layer thickness of the insulator 41.

In step S11, as shown in FIG. 9, a hole LH corresponding to the lower pillar LMH is formed by photolithography and anisotropic etching. The hole LH is formed to extend from the upper surface of the insulator 42 to reach the upper surface of the conductor 21. As anisotropic etching, for example, RIE (Reactive Ion Etching) is utilized. For example, SiO/SiN selective step etching is utilized in step S11.

In step S12, as shown in FIG. 10, a sacrificial member 43 is formed inside the hole LH. The sacrificial member 43, for example, fills the entire hole LH, and is also formed on the insulator 42. As the sacrificial member 43, for example, amorphous silicon aSi is used.

Figure 11:
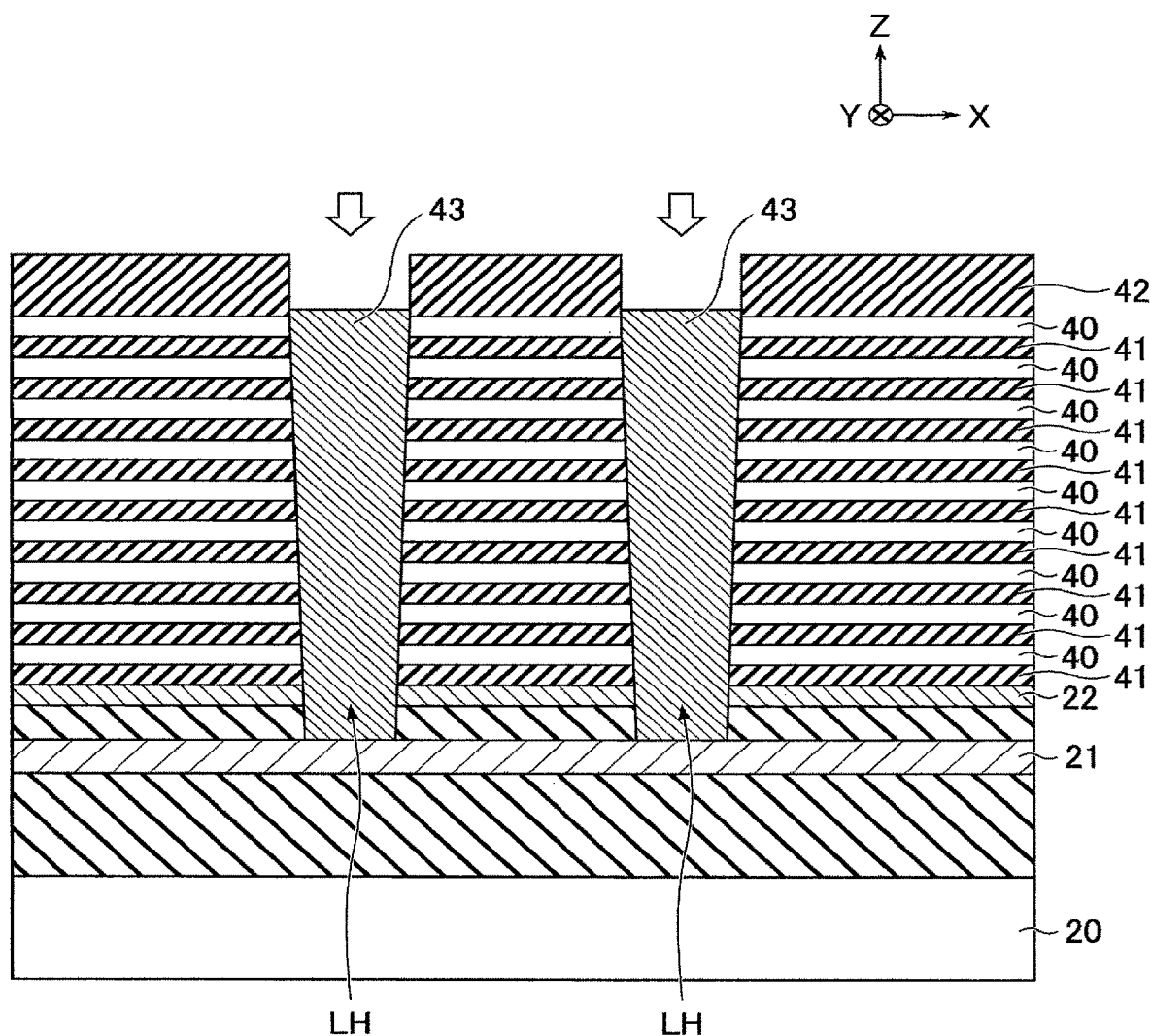

In step S13, as shown in FIG. 11, the sacrificial member 43 is etched back, and the sacrificial member 43 on the insulator 42 is removed. The sacrificial member 43 formed in the hole LH is etched back to the extent that the uppermost replacement member 40 is not exposed.

In step S14, as shown in FIG. 12, the insulator 42 is processed by wet etching. Specifically, the diameter of an opening of the hole LH where the sacrificial member 43 is removed increases, and a film thickness of the insulator 42 decreases.

Figure 13:
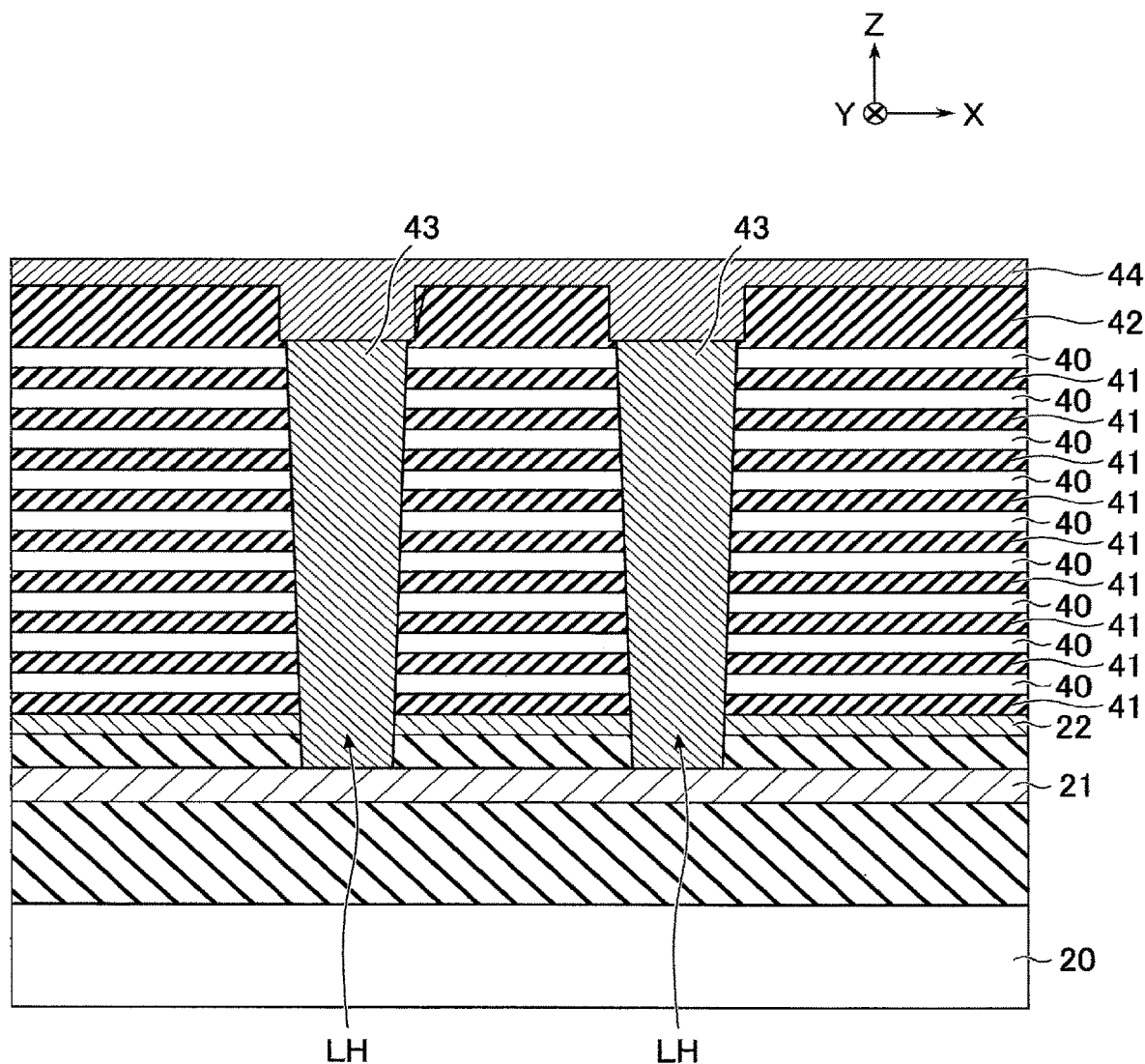

In step S15, as shown in FIG. 13, a sacrificial member 44 is formed in the opening of the hole LH. The sacrificial member 44, for example, fills the entire opening of the hole LH, and is also formed on the insulator 42. As the sacrificial member 44, for example, amorphous silicon aSi similar to the sacrificial member 43 is used.

In step S16, as shown in FIG. 14, the sacrificial member 44 is etched back, and the sacrificial member 44 on the insulator 42 is removed. At this time, for example, the processing is performed so that the upper surface of the sacrificial member 44 is aligned with the upper surface of the insulator 42.

In step S17, as shown in FIG. 15, the insulator 42 is processed by wet etching. Specifically, the film thickness of the insulator 42 decreases, and the upper surface of the sacrificial member 44 protrudes from the upper surface of the insulator 42.

Figure 16:
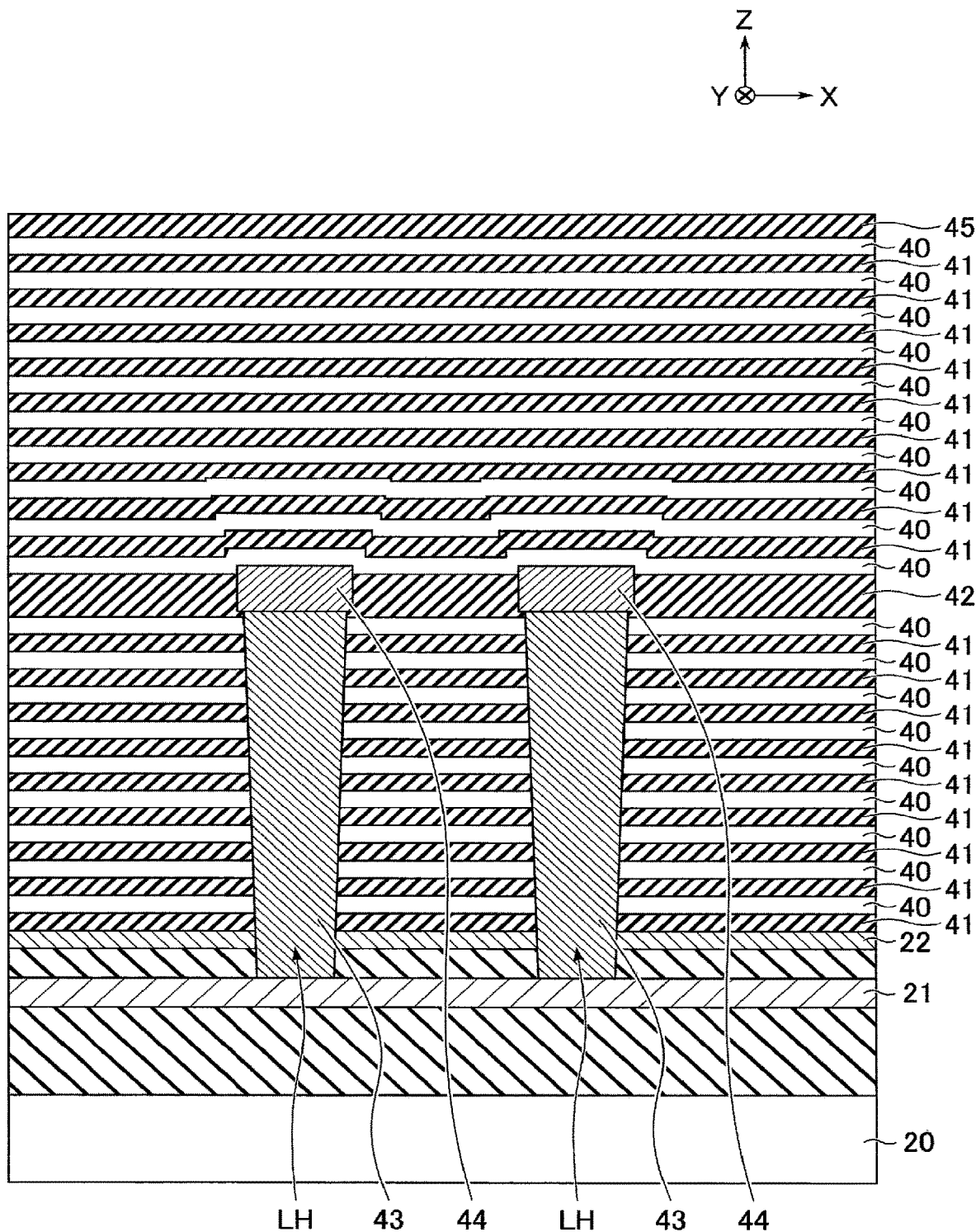

In step S18, as shown in FIG. 16, the insulators 41 and the replacement members 40 are alternately stacked on the insulator 42 and the sacrificial member 44. The number of layers in which the replacement members 40 are formed corresponds to the number of word lines WL, the dummy word line UDWL, and the selection gate line SGD corresponding to the upper pillar UMH. The replacement members 40 respectively correspond to the dummy word line UDWL, the word lines WL8 through WL15, and the selection gate line SGD in this order from the bottom. An insulator 45 is stacked on the uppermost replacement member 40. A layer thickness of the insulator 45 is, for example, larger than the layer thickness of the insulator 41.

Figure 17:
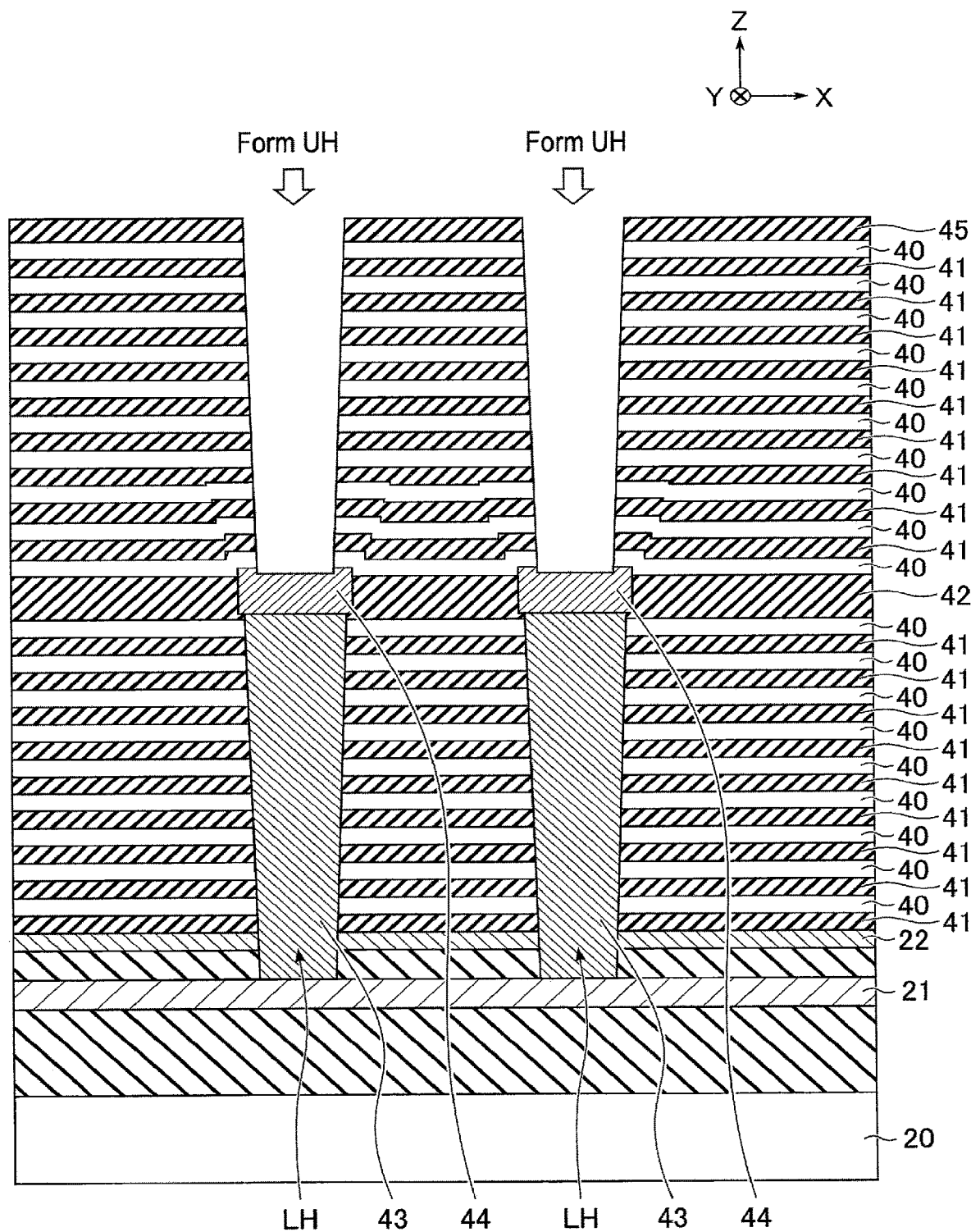

In step S19, as shown in FIG. 17, a hole UH corresponding to the upper pillar UMH is formed by photolithography and anisotropic etching. The hole UH is formed to extend from the upper surface of the insulator 45 to reach the upper surface of the sacrificial member 44. As anisotropic etching, for example, RIE (Reactive Ion Etching) is utilized. For example, SiO/SiN selective step etching is utilized in step S19.

In step S20, as shown in FIG. 18, the sacrificial members 43 and 44 formed in the hole LH are removed by wet etching. As a result, the hole LH and the hole UH are connected with each other, and the conductor 21 is exposed.

Figure 19:
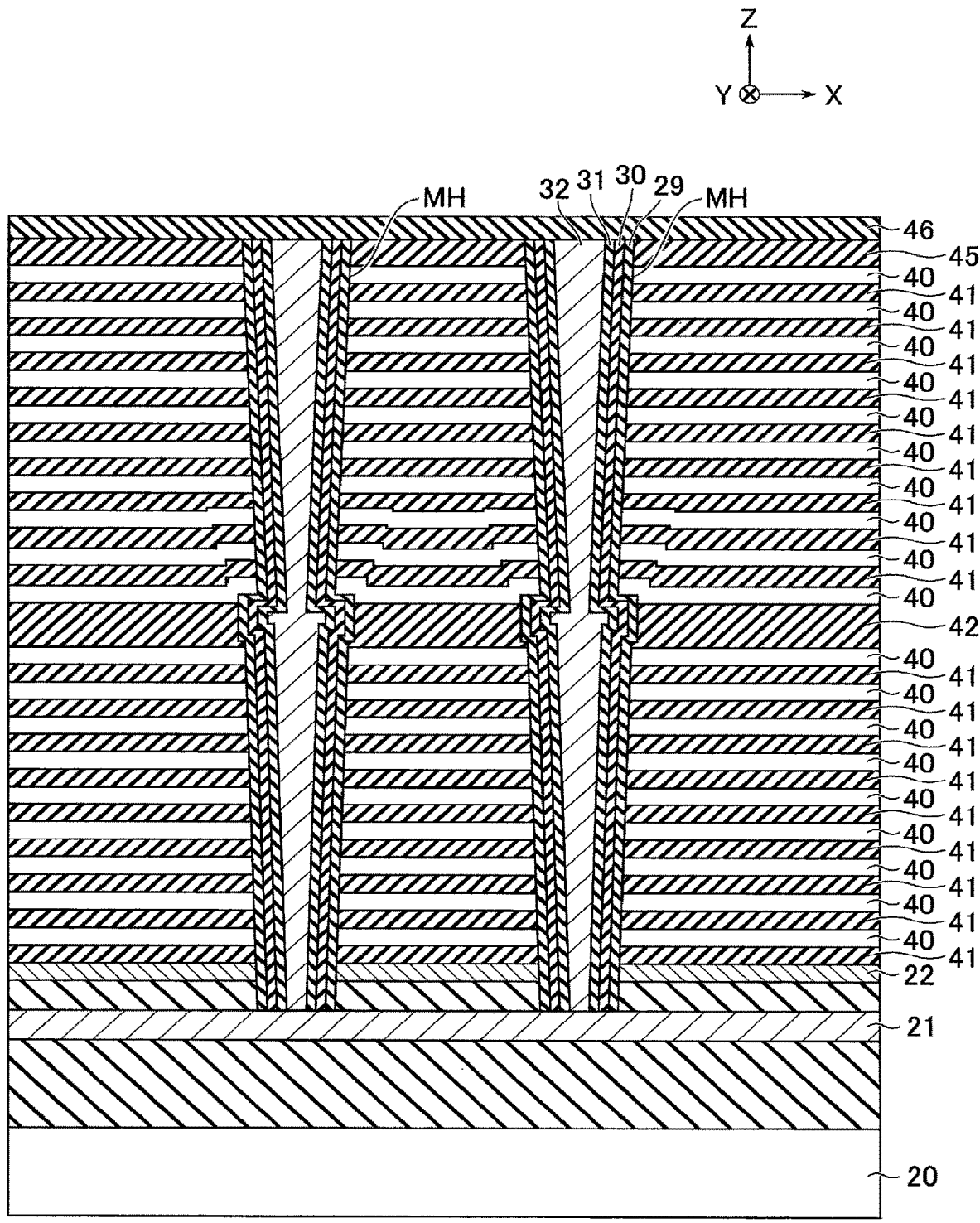

In step S21, as shown in FIG. 19, various materials are formed on the inner walls of the hole LH and the hole UH to form the memory pillar MH. Then, a protective film 46 is formed on the memory pillar MH and the insulator 45.

Figure 20:
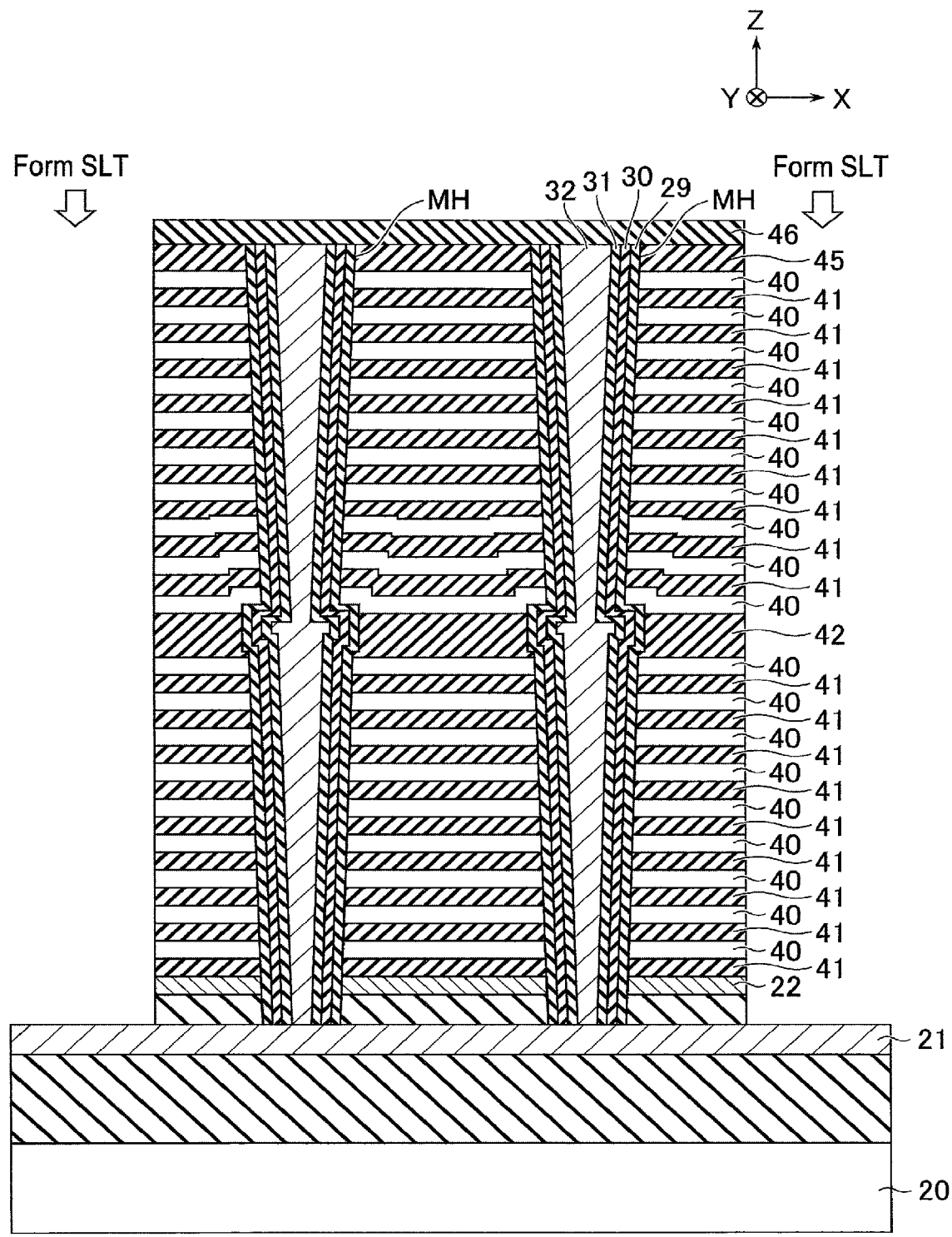

In step S22, as shown in FIG. 20, the slits SLT are formed. Specifically, the slits SLT are formed, for example, to extend from the upper surface of the protective film 46 to reach the upper surface of the conductor 21.

In step S23, as shown in FIG. 21, replacement processing for various kinds of wires is performed. Specifically, first, the replacement members 40 are removed by wet etching through the slits SLT. The structure from which the replacement members 40 are removed maintains its three-dimensional structure by, for example, the memory pillars MH and a supporting column formed in an area not shown. Then, a metal material functioning as wires of, for example, the word lines WL is formed in the space where the replacement members 40 were formed. After that, the metal material formed in the slits SLT and on the protective film 46 is removed by etching, and the metal material formed in the layers is separated.

The memory pillar MH and the various kinds of wires are formed by the manufacturing process described above. The manufacturing process described above is a mere example, and another process may be inserted between any two steps.

[1-3] Advantageous Effects

According to the above-described semiconductor memory 1 in the first embodiment, reliability of data retained by the semiconductor memory 1 can be improved. Advantageous effects of the semiconductor memory 1 according to the first embodiment will be described in detail below.

A method of forming a memory pillar by connecting a plurality of holes in a direction vertical to a substrate in order to increase a storage capacity per unit area in a semiconductor memory in which memory cells are three-dimensionally stacked, has been known.

When forming a memory pillar by connecting a plurality of holes, a joint portion may be provided between the connected holes. If a joint portion is provided, it becomes easier to process a semiconductor memory, and occurrence of defects by misalignment between adjacent holes is prevented. However, the electrical characteristics of the joint portion may be different from the electrical characteristics of the other areas in the memory pillar.

FIG. 22 shows an example of a cross-section structure of a memory cell array 10 in a comparative example of the first embodiment, and hatching and the structure is partly omitted from the drawing. In a cross-section structure of the memory cell array 10 in the comparative example, a conductor 25 (a dummy word line UDWL), through which an upper pillar UMH passes and which is adjacent to a joint portion JT, does not have a portion formed along the joint portion JT, which is different from the cross-section structure of the memory cell array 10 in the first embodiment described with reference to FIG. 5.

In the memory cell array 10 in the comparative example, a coupling capacity C1 between conductors 24 and 25 and a memory pillar MH in the area of the joint portion JT is smaller than a coupling capacity C2 between conductors 25 and 26 and a memory pillar MH in the layer between the conductors 25 and 26, and is smaller than a coupling capacity C3 between conductors 23 and 24 and a memory pillar MH in the layer between the conductors 23 and 24. This is because a layer thickness at the joint portion is larger than thicknesses of layers between the other word lines, and the distance between the wire adjacent to the joint portion JT and the channel in the joint portion JT is wider than that in the first embodiment.

As a result, in the semiconductor memory according to the comparative example, a voltage applied to the channel of the memory pillar MH at the joint portion JT is relatively smaller than a voltage applied to the channel of the memory pillar MH in layers between the other word lines. In this case, in the semiconductor memory according to the comparative example, in an erasure operation, for example, it may become difficult for a channel current to flow in the joint portion JT, and an erasure characteristic may be deteriorated.

On the other hand, in the semiconductor memory 1 according to the first embodiment, as shown in FIG. 5, the conductor 25 has the portion formed along the bending portion ST of the joint portion JT. Accordingly, in the semiconductor memory 1 according to the first embodiment, the dummy word line UDWL immediately above the joint portion JT has a structure closer to the channel in the joint portion JT of the memory pillar MH than in the semiconductor memory according to the comparative example.

This enables the semiconductor memory 1 according to the first embodiment to increase coupling capacities between dummy word lines LDWL and UDWL and the memory pillar MH at the joint portion JT. In other words, it may be easier to apply a voltage to the channel in the joint portion JT of the memory pillar MH in the semiconductor memory 1 according to the first embodiment than in the semiconductor memory according to the comparative example.

As a result, in the semiconductor memory 1 according to the first embodiment, reduction in the channel current at the joint portion JT may be prevented. Thus, for example, deterioration of erasure characteristics may be prevented. Accordingly, the semiconductor memory 1 according to the first embodiment may improve the reliability of data to be stored.

[2] Second Embodiment

In a semiconductor memory 1 according to a second embodiment, the joint portion JT between the lower pillar LMH and the upper pillar UMH is excluded from the semiconductor memory 1 of the first embodiment. In the following, differences of the semiconductor memory 1 according to the second embodiment from the first embodiment will be described.

[2-1] Configuration

FIG. 23 shows an example of a cross-section structure of a memory cell array 10 in the second embodiment, and shows a cross-section area of the memory cell array 10 in which interlayer insulation films are not shown, an X axis, a Y axis, and a Z axis. As shown in FIG. 23, a structure of a memory pillar MH in the cross-section structure of the memory cell array 10 in the second embodiment is different from the structure of the memory pillar MH in the cross-section structure of the memory cell array 10 in the first embodiment described with reference to FIG. 4.

Specifically, in the memory pillar MH in the second embodiment, the lower pillar LMH and the upper pillar UMH are directly joined to each other. In other words, the lower pillar LMH and the upper pillar UMH of the memory pillar MH in the second embodiment are joined to each other without the joint portion JT described in the first embodiment being interposed therebetween.

FIG. 24 shows an example of a detailed cross-section structure of the memory cell array 10, focusing on an area including a portion where the lower pillar LMH and the upper pillar UMH are joined to each other. In an XY plane including a boundary portion between the lower pillar LMH and the upper pillar UMH, as shown in FIG. 24, for example, an outer diameter LDI of the lower pillar LMH is larger than an outer diameter UDI of the upper pillar UMH.

In the second embodiment, a conductor 25 (a dummy word line UDWL), through which the upper pillar UMH passes and that is provided next to the boundary portion between the lower pillar LMH and the upper pillar UMH, has a portion BE1 bending along the shape of the lower pillar LMH.

A conductor 26 (a word line WL8), through which the upper pillar UMH passes and that is provided next to the conductor 25, has a portion BE2 bending indirectly along the shape of the lower pillar LMH. In other words, the conductor 26 bends along the portion where the conductor 25 bends along the lower pillar LMH. In this case, a bending amount of the conductor 25 (the dummy word line UDWL) at the portion BE1 is larger than a bending amount of the conductor 26 (the word line WL8) at the portion BE2.

In the second embodiment, the portion where the conductor 25 bends along the lower pillar LMH and comes into contact with the lower pillar LMH is hereinafter called a bending portion ST. At the bending portion ST, an insulation film different from a block insulation film 29 may be provided between the lower pillar LMH and the conductor 25.

A height ΔST of the bending portion ST in the second embodiment is defined by, for example, the distance in the Z direction between a cross-section area of the memory pillar MH parallel to an XY plane and including a portion where the conductor 25 is the most distant from the semiconductor substrate 20 in the Z direction and a cross-section area of the memory pillar MH parallel to the XY plane and including a portion where the conductor 25 is the closest to the semiconductor substrate 20 in the Z direction. Furthermore, the height ΔST is determined to be, for example, smaller than a thickness LTS of the conductor 25 in the Z direction, and is preferably determined to be equal to or smaller than a half of the thickness LTS.

In the second embodiment, a distance JTS in the Z direction between a conductor 24 and the conductor 25 is determined to be, for example, larger than the distance between adjacent conductors 23 in the Z direction, and larger than the distance between adjacent conductors 26 in the Z direction, similarly to the first embodiment.

The other configurations of the semiconductor memory 1 according to the second embodiment are the same as those of the semiconductor memory 1 according to the first embodiment; therefore, the descriptions thereof are omitted.

[2-2] Manufacturing Method

Figure 25:
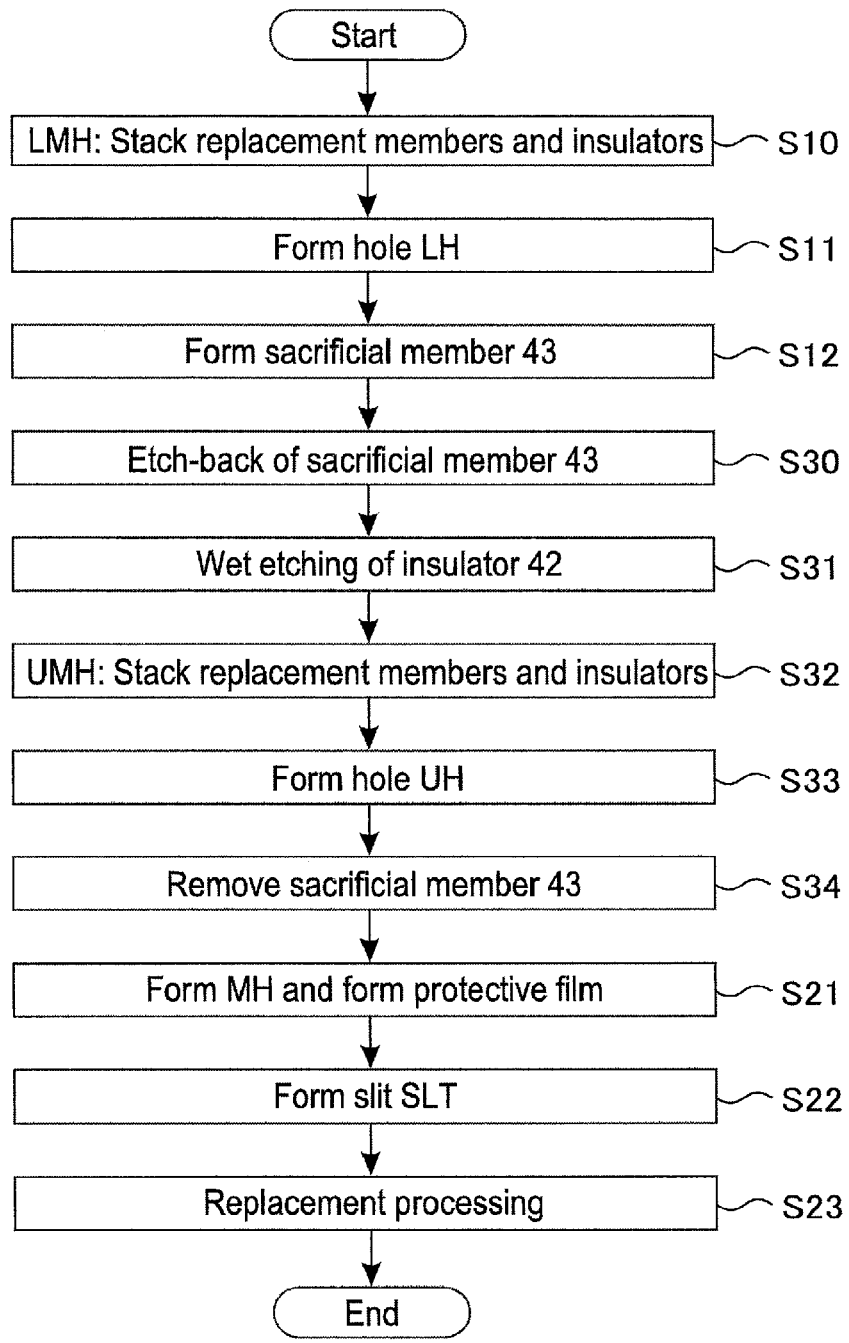
FIG. 25 is a flowchart showing an example of a method for manufacturing the semiconductor memory according to the second embodiment.

FIG. 25 shows an example of a manufacturing process of the semiconductor memory 1 according to the second embodiment. FIG. 26 through FIG. 34 show an example of cross-section structures in steps of manufacturing the memory cell array 10. In the following, a process starting from the step of stacking replacement members and insulators for forming word lines WL, etc. to the step of forming the word lines WL will be described with reference to FIG. 25.

The description of manufacturing steps starts from, for example, a structure halfway through the manufacturing of the semiconductor memory 1 shown in FIG. 7, similar to the first embodiment. Then, processing of the steps S10 through S12 described in the first embodiment is performed, and a sacrificial member 43 is formed inside a hole LH as shown in FIG. 26. The sacrificial member 43, for example, fills the entire hole LH, and is also formed on an insulator 42. A layer thickness of the insulator 42 is, for example, smaller than the layer thickness of the insulator 42 in the processing of step S12 described in the first embodiment.

In step S30, as shown in FIG. 27, the sacrificial member 43 is etched back, and the sacrificial member 43 on the insulator 42 is removed. At this time, for example, the processing is performed so that the upper surface of the sacrificial member 43 is aligned with the upper surface of the insulator 42.

In step S31, as shown in FIG. 28, the insulator 42 is processed by wet etching. Specifically, the film thickness of the insulator 42 decreases, and the upper surface of the sacrificial member 43 protrudes from the upper surface of the insulator 42.

In step S32, as shown in FIG. 29, the insulators 41 and the replacement members 40 are alternately stacked on the insulator 42 and the sacrificial member 43. The number of layers in which the replacement members 40 are formed corresponds to the number of word lines WL, the dummy word line UDWL, and the selection gate line SGD corresponding to the upper pillar UMH. An insulator 45 is stacked on the uppermost replacement member 40. A layer thickness of the insulator 45 is, for example, larger than a layer thickness of the insulator 41.

In step S33, as shown in FIG. 30, a hole UH corresponding to the upper pillar UMH is formed by photolithography and anisotropic etching. The hole UH is formed to extend from the upper surface of the insulator 45 to reach the upper surface of the sacrificial member 43. As anisotropic etching, for example, RIE (Reactive Ion Etching) is utilized. For example, SiO/SiN selective step etching is utilized in step S33.

Figure 31:
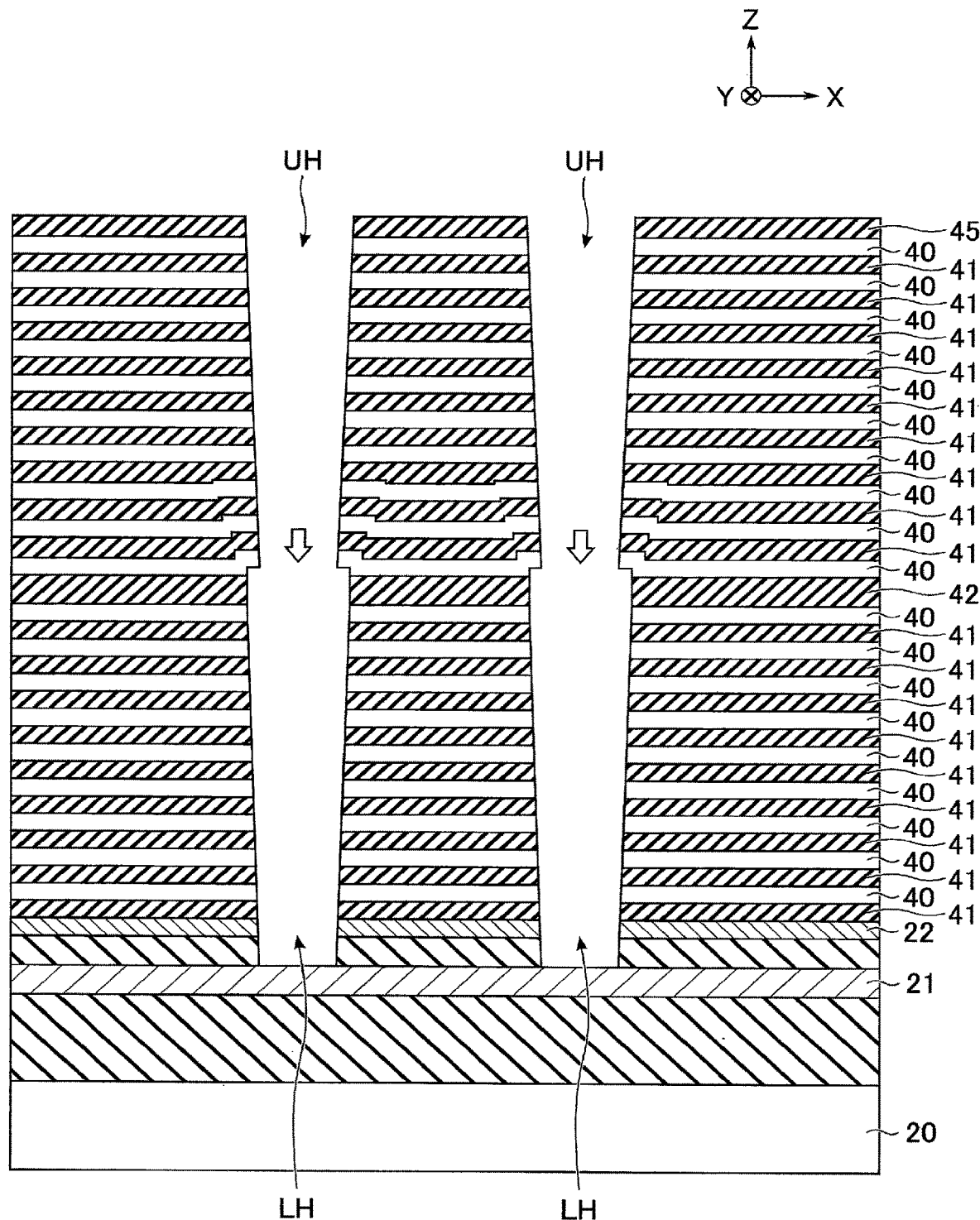

In step S34, as shown in FIG. 31, the sacrificial members 43 formed in the hole LH are removed by wet etching. As a result, the hole LH and the hole UH are connected with each other, and the conductor 21 is exposed. Subsequent manufacturing processes of the semiconductor memory 1 according to the second embodiment are the same as the manufacturing processes of the semiconductor memory 1 according to the first embodiment from step S21.

Figure 32:
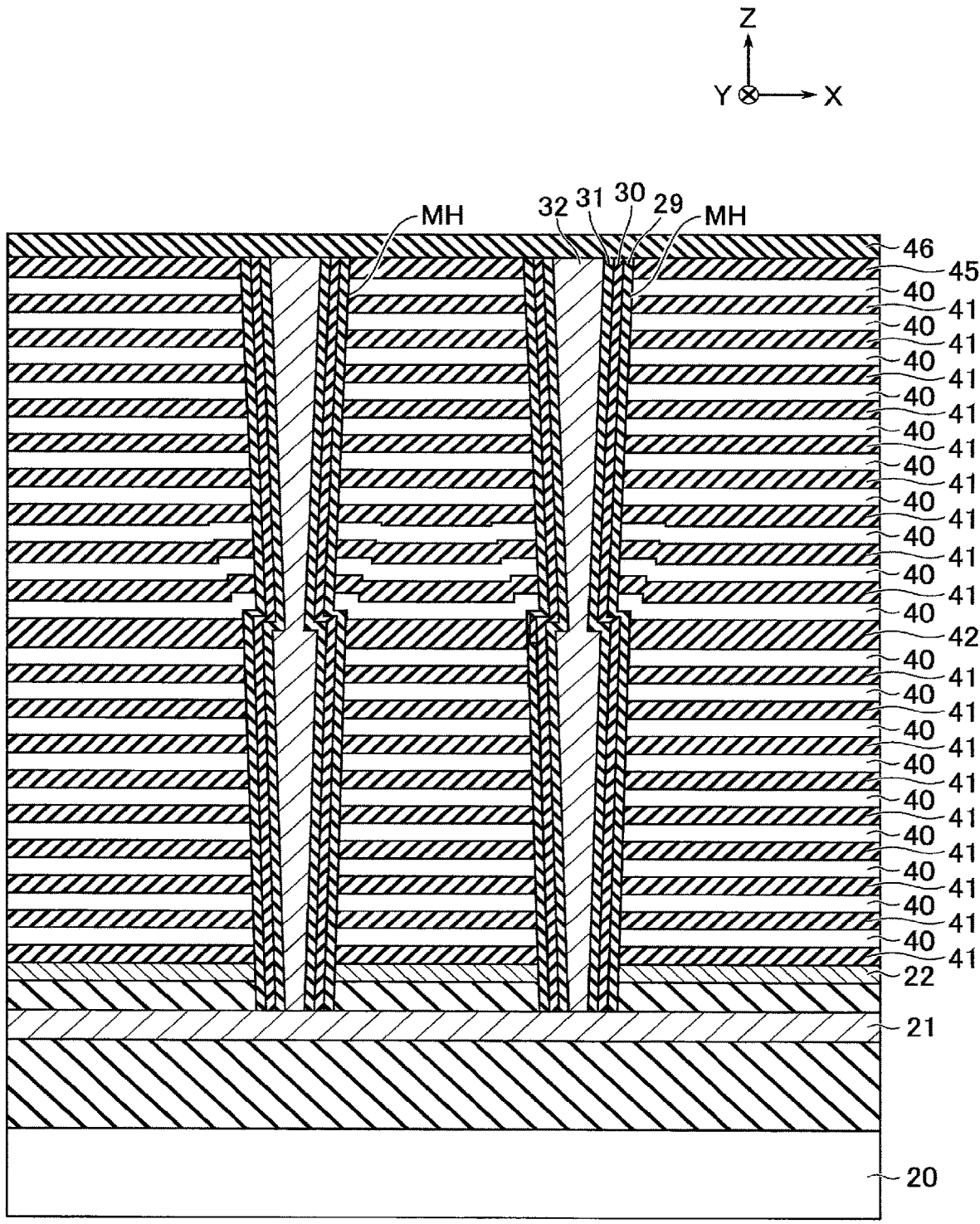

Specifically, in step S21, as shown in FIG. 32, various materials are formed on the inner walls of the hole LH and the hole UH to form the memory pillar MH. Then, a protective film 46 is formed on the memory pillar MH and the insulator 45.

Figure 33:
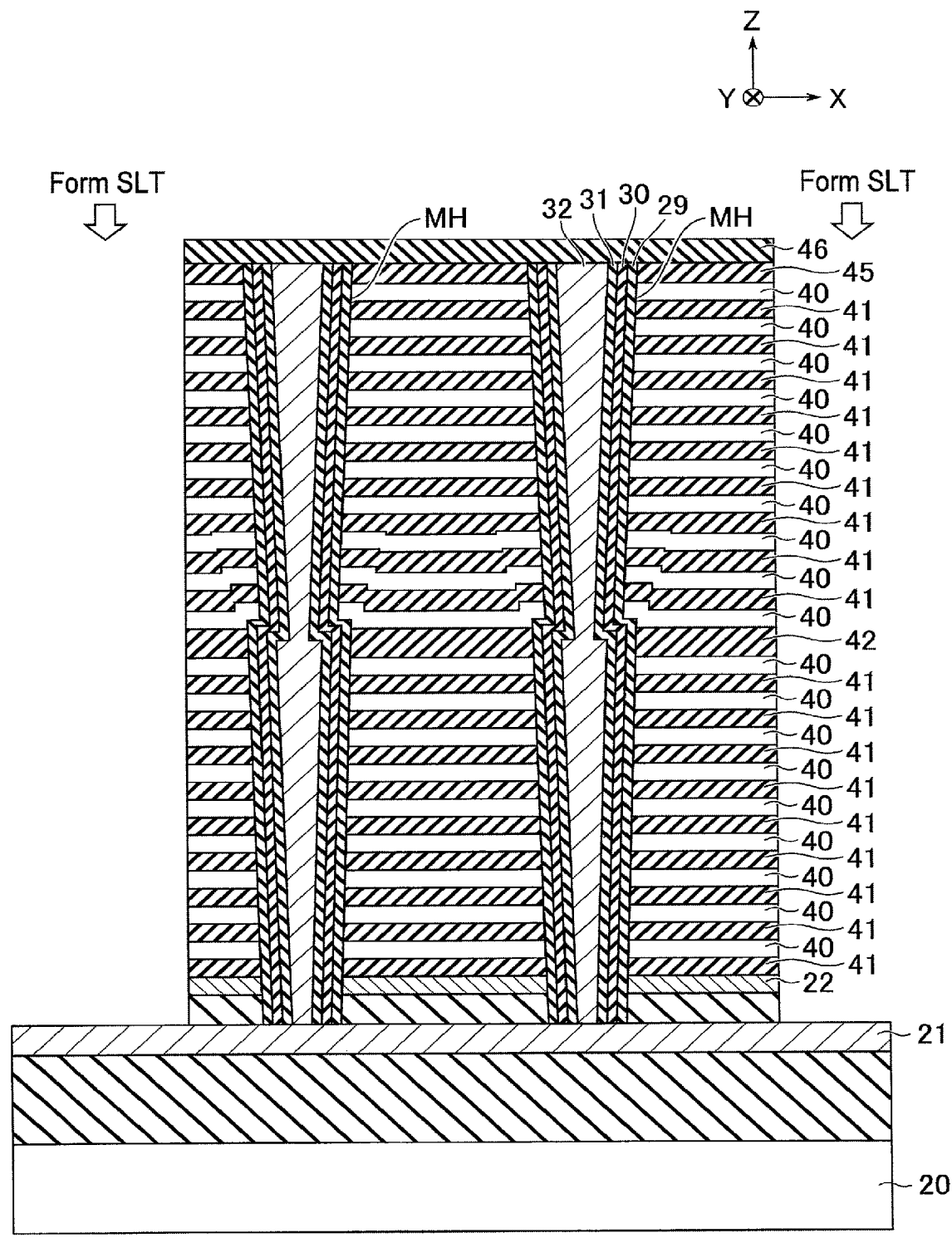

In step S22, as shown in FIG. 33, the slits SLT are formed. Specifically, the slits SLT are formed, for example, to extend from the upper surface of the protective film 46 to reach the upper surface of the conductor 21.

In step S23, as shown in FIG. 34, replacement processing for various kinds of wires is performed. Specifically, first, the replacement members 40 are removed by wet etching through the slits SLT. Then, a metal material corresponding to the word lines WL, the dummy word lines LDWL and UDWL, and the selection gate line SGD is formed in the space where the replacement members 40 were formed. The metal material formed in the slits SLT and on the protective film 46 is removed by etching.

The memory pillar MH and the various kinds of wires are formed by the manufacturing process described above. The manufacturing process described above is a mere example, and another process may be inserted between any two steps.

[2-3] Advantageous Effects

According to the above-described semiconductor memory 1 in the second embodiment, reliability of data retained by the semiconductor memory 1 can be improved, similarly to the semiconductor memory 1 according to the first embodiment.

Furthermore, in the semiconductor memory 1 according to the second embodiment, the joint portion JT is excluded from the semiconductor memory 1 according to the first embodiment. As a result, the semiconductor memory 1 according to the second embodiment can reduce its manufacturing steps compared to the manufacturing steps of the semiconductor memory 1 according to the first embodiment, as described with reference to FIG. 25. Thus, the semiconductor memory 1 according to the second embodiment can reduce manufacturing costs compared to the semiconductor memory 1 according to the first embodiment.

[3] Modifications

A semiconductor memory (for example, 1 in FIG. 1) of the embodiments includes a plurality of conductors (for example, 22 to 27 in FIG. 4) stacked with insulators being interposed therebetween and a pillar (for example, MH in FIG. 4) passing through the plurality of conductors. The pillar includes a first columnar section (for example, LMH in FIG. 4), a second columnar section (for example, UMH in FIG. 4), and a joint portion (for example, JT in FIG. 4) between the first columnar section and the second columnar section. The pillar comprises portions that cross the respective conductors and that each function as part of a transistor. The plurality of conductors include a first conductor (for example, 25 in FIG. 5). The first conductor is closest to the joint portion among the plurality of conductors through the second columnar section, and includes a bending portion (for example, ST in FIG. 5) formed along the joint portion. Thus, the reliability of data retained by the semiconductor memory 1 can be improved.

In the manufacturing process of the semiconductor memory 1 according to the first embodiment, the case of starting the stacking from the replacement member 40 in step S18 is described as an example; however, the manufacturing process is not limited thereto. For example, the stacking may be started from the insulator 41 in step S18. An example of a cross-section structure of a memory cell array 10 in the modification of the first embodiment in this case is shown in FIG. 35.

As shown in FIG. 35, if the stacking is started from the insulator 41 in step S18, the distance between the joint portion JT and the conductor 25 is widened by the thickness of the insulator 41. Advantageous effects similar to the first embodiment may be also obtained in such a case, since the conductor 25 has a structure along the joint portion JT, thereby making it easier to apply a voltage to the joint portion JT.

Similarly, in the manufacturing process of the semiconductor memory 1 according to the second embodiment, the case of starting the stacking from the replacement member 40 in step S32 is described as an example; however, the manufacturing process is not limited thereto. For example, the stacking may be started from the insulator 41 in step S32. An example of a cross-section structure of a memory cell array 10 in the modification of the second embodiment in this case is shown in FIG. 36.

Figure 36:
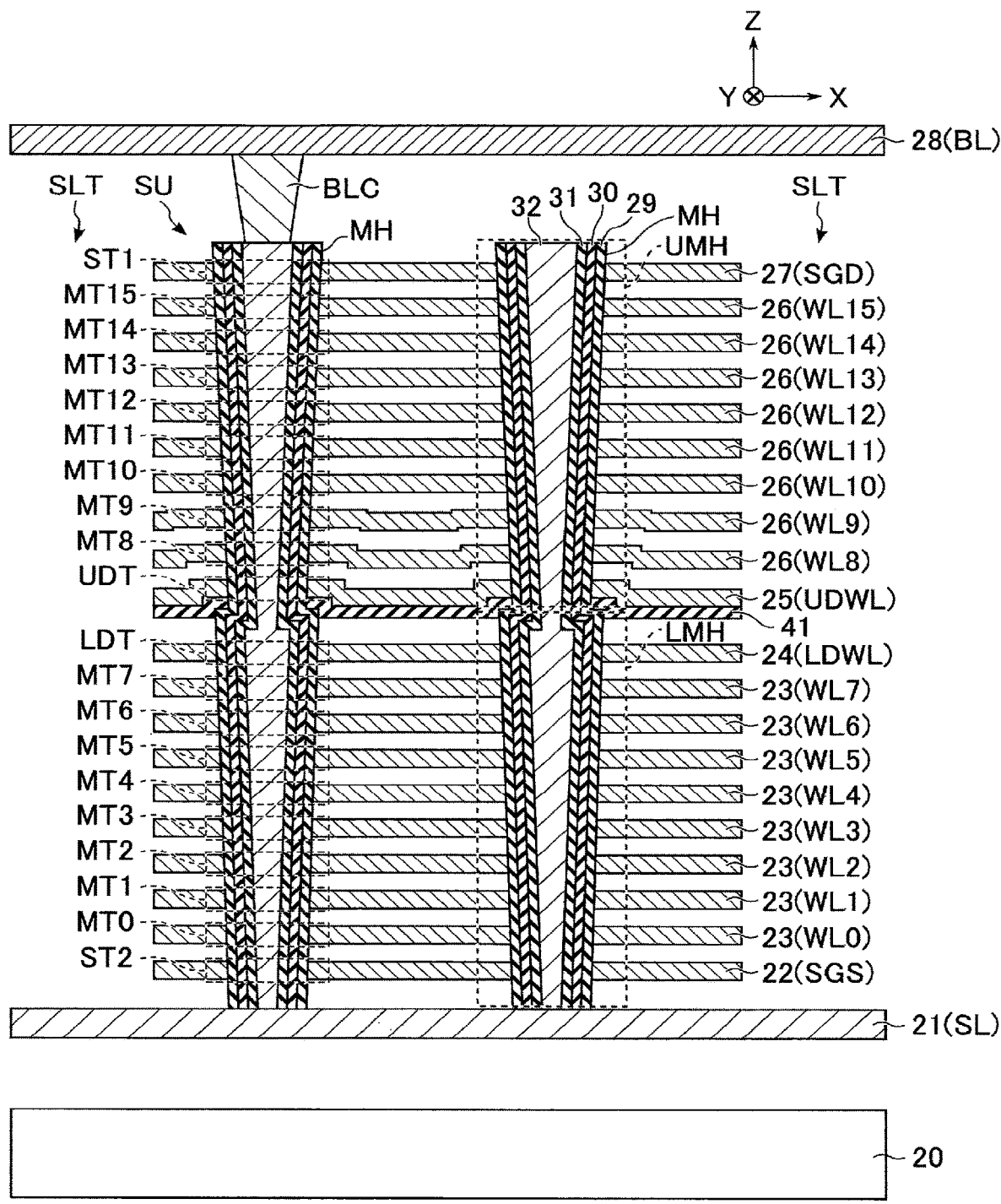
FIG. 36 is a cross-sectional view showing an example of a cross-section structure of a memory cell array according to a modification of the second embodiment.

As shown in FIG. 36, if the stacking is started from the insulator 41 in step S32, the distance between the lower pillar LMH and the conductor 25 is widened by the thickness of the insulator 41. Advantageous effects similar to the second embodiment may be also obtained in such a case, since the conductor 25 has a structure along the top end of the lower pillar LMH, thereby making it easier to apply a voltage to the portion where the lower pillar LMH and the upper pillar UMH are joined to each other.

In the first embodiment, the side surface of the joint portion JT is shown as vertical; however, the shape of the joint portion JT is not limited thereto. For example, the shape of the joint portion JT may be, for example, a barrel shape which swells midway, a tapered shape of which the diameter increases upward, or an inverse-tapered shape of which the diameter increases downward.

In the above embodiments, the case where each shape of the lower pillar LMH and the upper pillar UMH is a tapered shape having a diameter which becomes smaller as it comes closer to the semiconductor substrate is described as an example; however, each shape of the lower pillar LMH and the upper pillar UMH is not limited thereto. For example, each shape of the lower pillar LMH and the upper pillar UMH may be, for example, a barrel shape which swells midway, or an inverse-tapered shape of which the diameter increases toward the side of the substrate.

Furthermore, in the above embodiments, the case where the memory pillar MH has a two-stage structure with the lower pillar LMH and the upper pillar UMH is described as an example; however, the structure of the memory pillar MH is not limited thereto. The memory pillar MH may have a structure in which three or more stages of pillars having a structure similar to the lower pillar LMH or the upper pillar UMH are connected in the Z direction.

In this case, the memory pillar MH may include a plurality of joint portions JT each corresponding to the joint portion JT described in the first embodiment, may have a structure in which the joint portion JT is excluded as in the memory cell array 10 described in the second embodiment, or may be a combination thereof. Advantageous effects similar to the first or second embodiment may be also obtained in such a structure by providing a conductor, which is adjacent to the joint portions JT or to a portion where the pillars are joined, in the manner described in the first or second embodiment.

Moreover, in the above embodiments, the case where the lower hole LH is formed to reach the surface of the corresponding conductor 21 and the slit SLT is formed to reach the surface of the conductor 21 is described as an example; however, the configuration is not limited thereto. For example, when forming the hole and the slit SLT, over-etching may be performed. The bottom surface of the hole or the bottom surface of the slit SLT may be formed not only on the surface of a conductor, but also in the conductor. By performing over-etching when forming a hole, electrical coupling between the semiconductor material inside the memory pillar MH and the conductor 21 that functions as the source line SL may be more reliable.

In the present description, the term "coupled" means an electrical coupling, and does not exclude a coupling with an element being interposed in the coupling, for example.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory comprising:
a plurality of conductors stacked in a first direction with insulators being interposed therebetween; and
a pillar extending in the first direction through the plurality of conductors, the pillar including a first columnar section, a second columnar section above the first columnar section, and a joint portion between the first columnar section and the second columnar section, and the pillar comprising portions that cross the respective conductors, the portions respectively functioning as part of a transistor,
wherein the plurality of conductors include a first conductor that is closest to the joint portion among the plurality of conductors through the second columnar section, the first conductor includes a first portion surrounding the pillar, a second portion surrounding the first portion, and a third portion surrounding the second portion when viewed from the first direction, a bottom surface of the second portion has the same level in the first direction as a bottom surface of the third portion, and a bottom surface of the first portion is upper than the bottom surfaces of the second and third portions.

2. The memory of claim 1, wherein the joint portion abuts each of the first columnar section and the second columnar section.

3. The memory of claim 2, wherein an outer diameter of the joint portion in a cross-section area parallel to a surface of a substrate, is larger than an outer diameter of the second columnar section in a cross-section area parallel to the surface of the substrate and including a boundary portion between the second columnar section and the joint portion.

4. The memory of claim 3, wherein the outer diameter of the joint portion is larger than an outer diameter of the first columnar section in a cross-section area parallel to the substrate and including a boundary portion between the first columnar section and the joint portion.

5. The memory of claim 3, wherein a distance, in the first direction between the bottom surface of the first portion and the bottom surface of the third portion is smaller than a thickness of the first conductor in the first direction.

6. The memory of claim 5, wherein the distance is equal to or smaller than a half of the thickness.

7. The memory of claim 1, wherein the plurality of conductors include a second conductor that is second closest to the joint portion among the plurality of conductors through the second columnar section, and the second conductor includes a portion bending indirectly along the joint portion.

8. The memory of claim 1, wherein a transistor provided in a portion where the first conductor crosses the second columnar section is not used for storing data.

9. The memory of claim 1, wherein the plurality of conductors include a third conductor that is closest to the joint portion among the plurality of conductors through the first columnar section,
a first distance is smaller than a second distance,
the first distance is a distance, in a stacking direction of the plurality of conductors, between adjacent conductors among the plurality of conductors through the second columnar section, and
the second distance is a distance in the stacking direction between the first conductor and the third conductor.

10. The memory of claim 9, wherein the third conductor has no portion bending along the joint portion.

11. The memory of claim 9, wherein a transistor provided in a portion where the third conductor crosses the first columnar section is not used for storing data.

12. A semiconductor memory comprising:
a plurality of conductors stacked in a first direction with insulators being interposed therebetween; and
a pillar extending in the first direction through the plurality of conductors, the pillar including a first columnar section and a second columnar section on the first columnar section, and the pillar comprising portions that cross the respective conductors, the portions respectively functioning as part of a transistor,
wherein the plurality of conductors include a first conductor that is closest to the first columnar section among the plurality of conductors through the second columnar section, the first conductor includes a first portion surrounding the pillar, a second portion surrounding the first portion, and a third portion surrounding the second portion when viewed from the first direction, a bottom surface of the second portion has the same level in the first direction as a bottom surface of the third portion, and a bottom surface of the first portion is upper than the bottom surfaces of the second and third portions.

13. The memory of claim 12, wherein, in a boundary portion between the first columnar section and the second columnar section, an outer diameter of the first columnar section in a cross-section area parallel to a surface of a substrate is larger than an outer diameter of the second columnar section in a cross-section area parallel to the surface of the substrate.

14. The memory of claim 13, wherein a distance, in the first direction between the bottom surface of the first portion and the bottom surface of the third portion is smaller than a thickness of the first conductor in the first direction.

15. The memory of claim 14, wherein the distance is equal to or smaller than a half of the thickness.

16. The memory of claim 12, wherein the plurality of conductors include a second conductor that is second closest to the first columnar section among the plurality of conductors through the second columnar section, and the second conductor includes a portion bending indirectly along the first columnar section.

17. The memory of claim 12, wherein a transistor provided in a portion where the first conductor crosses the second columnar section is not used for storing data.

18. The memory of claim 12, wherein the plurality of conductors include a third conductor that is closest to the second columnar section among the plurality of conductors through the first columnar section,
   a first distance is smaller than a second distance,
   the first distance is a distance, in a stacking direction of the plurality of conductors, between adjacent conductors among the plurality of conductors through the second columnar section,
   the second distance is a distance in the stacking direction between the first conductor and the third conductor.

19. The memory of claim 18, wherein the third conductor has no portion bending along the joint portion.

20. The memory of claim 18, wherein a transistor provided in a portion where the third conductor crosses the first columnar section is not used for storing data.

* * * * *